US011367751B2

(12) United States Patent
Bateman

(10) Patent No.: US 11,367,751 B2
(45) Date of Patent: *Jun. 21, 2022

(54) VERTICAL CROSS-POINT ARRAYS FOR ULTRA-HIGH-DENSITY MEMORY APPLICATIONS

(71) Applicant: Unity Semiconductor Corporation, San Jose, CA (US)

(72) Inventor: Bruce Lynn Bateman, Fremont, CA (US)

(73) Assignee: Unity Semiconductor Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/948,575

(22) Filed: Sep. 23, 2020

(65) Prior Publication Data

US 2021/0083005 A1 Mar. 18, 2021

Related U.S. Application Data

(63) Continuation of application No. 15/633,050, filed on Jun. 26, 2017, now Pat. No. 10,790,334, which is a
(Continued)

(51) Int. Cl.
*H01L 45/02* (2006.01)
*H01L 27/24* (2006.01)
*H01L 45/00* (2006.01)

(52) U.S. Cl.
CPC ........ *H01L 27/249* (2013.01); *H01L 27/2418* (2013.01); *H01L 27/2454* (2013.01);
(Continued)

(58) Field of Classification Search
None
See application file for complete search history.

(56) References Cited

U.S. PATENT DOCUMENTS 5,483,482 A 1/1996 Yamada et al.
5,991,193 A 11/1999 Gallagher et al.
(Continued)

OTHER PUBLICATIONS

Abelmann et al., "Self-Assembled Three-Dimensional Non-Volatile Memories," Micromachines 2010, vol. 1, pp. 1-18, Jan. 18, 2010. 18 pages.

(Continued)

*Primary Examiner* — Benjamin P Sandvik
(74) *Attorney, Agent, or Firm* — Lowenstein Sandler LLP

(57) ABSTRACT

An ultra-high-density vertical cross-point array comprises a plurality of horizontal line layers having horizontal lines interleaved with a plurality of vertical lines arranged in rows and columns. The vertical lines are interleaved with the horizontal lines such that a row of vertical lines is positioned between each consecutive pair of horizontal lines in each horizontal line layer. Each vertical line comprises a center conductor surrounded by a single or multi-layered memory film. Accordingly, when interleaved with the horizontal lines, two-terminal memory cells are integrally formed between the center conductor of each vertical line and each crossing horizontal line. By configuring the vertical and horizontal lines so that a row of vertical lines is positioned between each consecutive pair of horizontal lines, a unit memory cell footprint of just $2F^2$ may be realized.

20 Claims, 30 Drawing Sheets

Related U.S. Application Data continuation of application No. 15/095,542, filed on Apr. 11, 2016, now Pat. No. 9,691,821, which is a continuation of application No. 14/568,802, filed on Dec. 12, 2014, now Pat. No. 9,312,307, which is a continuation of application No. 13/210,292, filed on Aug. 15, 2011, now Pat. No. 8,937,292.

(52) U.S. Cl.
CPC .......... *H01L 45/08* (2013.01); *H01L 45/1226* (2013.01); *H01L 45/1233* (2013.01); *H01L 45/146* (2013.01); *H01L 45/147* (2013.01)

(56) References Cited

U.S. PATENT DOCUMENTS

| | | | |
|---|---|---|---|
| 6,034,882 A | 3/2000 | Johnson et al. | |
| 6,128,214 A | 10/2000 | Kuekes et al. | |
| 6,185,122 B1 | 2/2001 | Johnson et al. | |
| 6,204,139 B1 | 3/2001 | Liu et al. | |
| 6,351,406 B1 | 2/2002 | Johnson et al. | |
| 6,385,074 B1 | 5/2002 | Johnson et al. | |
| 6,407,953 B1 | 6/2002 | Cleeves | |
| 6,420,215 B1 | 7/2002 | Knall et al. | |
| 6,459,095 B1 | 10/2002 | Heath et al. | |
| 6,473,332 B1 | 10/2002 | Ignatiev et al. | |
| 6,504,753 B1 | 1/2003 | Scheuerlein et al. | |
| 6,515,888 B2 | 2/2003 | Johnson et al. | |
| 6,515,904 B2 | 2/2003 | Moore et al. | |
| 6,522,594 B1 | 2/2003 | Scheuerlein | |
| 6,525,953 B1 | 2/2003 | Johnson | |
| 6,534,403 B2 | 3/2003 | Cleeves | |
| 6,545,891 B1 | 4/2003 | Tringali et al. | |
| 6,569,745 B2 | 5/2003 | Hsu | |
| 6,599,796 B2 | 7/2003 | Mei et al. | |
| 6,631,085 B2 | 10/2003 | Kleveland et al. | |
| 6,642,539 B2 | 11/2003 | Ramest et al. | |
| 6,693,821 B2 | 2/2004 | Hsu et al. | |
| 6,759,249 B2 | 7/2004 | Zhuang et al. | |
| 6,777,248 B1 | 8/2004 | Nabatame et al. | |
| 6,816,410 B2 | 11/2004 | Kleveland et al. | |
| 6,822,903 B2 | 11/2004 | Scheuerlein et al. | |
| 6,836,421 B2 | 12/2004 | Rinerson et al. | |
| 6,850,455 B2 | 2/2005 | Rinerson et al. | |
| 6,859,382 B2 | 2/2005 | Rinerson et al. | |
| 6,882,553 B2 | 4/2005 | Nejad et al. | |
| 6,917,539 B2 | 7/2005 | Rinerson et al. | |
| 6,927,430 B2 | 8/2005 | Hsu | |
| 6,937,505 B2 | 8/2005 | Morikawa | |
| 6,940,113 B2 | 9/2005 | Hsu et al. | |
| 6,940,744 B2 | 9/2005 | Rinerson et al. | |
| 6,970,375 B2 | 11/2005 | Rinerson et al. | |
| 7,001,846 B2 | 2/2006 | Hsu | |
| 7,009,909 B2 | 3/2006 | Rinerson et al. | |
| 7,020,006 B2 | 3/2006 | Chevallier et al. | |
| 7,022,572 B2 | 4/2006 | Scheuerlein et al. | |
| 7,023,743 B2 | 4/2006 | Nejad et al. | |
| 7,046,550 B1 | 5/2006 | Reohr et al. | |
| 7,057,914 B2 | 6/2006 | Rinerson et al. | |
| 7,079,442 B2 | 7/2006 | Rinerson et al. | |
| 7,141,481 B2 | 11/2006 | Hsu et al. | |
| 7,177,181 B1 | 2/2007 | Scheuerlein | |
| 7,256,415 B2 | 8/2007 | Furukawa et al. | |
| 7,339,811 B2 | 3/2008 | Nejad et al. | |
| 7,372,753 B1 | 5/2008 | Rinerson et al. | |
| 7,379,364 B2 | 5/2008 | Siau et al. | |
| 7,394,680 B2 | 7/2008 | Toda et al. | |
| 7,405,960 B2 | 7/2008 | Cho et al. | |
| 7,411,811 B2 | 8/2008 | Inoue | |
| 7,417,271 B2 | 8/2008 | Genrikh et al. | |
| 7,443,711 B1 | 10/2008 | Stewart et al. | |
| 7,463,546 B2 | 12/2008 | Fasoli et al. | |
| 7,498,600 B2 | 3/2009 | Cho et al. | |
| 7,505,344 B2 | 3/2009 | Scheuerlein | |
| 7,508,695 B2 | 3/2009 | Sugita | |
| 7,608,467 B2 | 10/2009 | Wu et al. | |
| 7,639,521 B2 | 12/2009 | Baek et al. | |
| 7,643,344 B2 | 1/2010 | Choi | |
| 7,701,791 B2 | 4/2010 | Rinerson et al. | |
| 7,706,177 B2 | 4/2010 | Petti | |
| 7,719,876 B2 | 5/2010 | Chevallier et al. | |
| 7,733,685 B2 | 6/2010 | Scheuerlein et al. | |
| 7,742,323 B2 | 6/2010 | Rinerson et al. | |
| 7,782,650 B2 | 8/2010 | Bertin et al. | |
| 7,842,991 B2 | 11/2010 | Cho et al. | |
| 7,884,349 B2 | 2/2011 | Rinerson et al. | |
| 7,898,841 B2 | 3/2011 | Chevallier et al. | |
| 7,902,867 B2 | 3/2011 | Mouttet | |
| 7,902,868 B2 | 3/2011 | Norman | |
| 7,955,871 B2 | 6/2011 | Wu et al. | |
| 7,983,065 B2 | 7/2011 | Samachisa | |
| 8,003,511 B2 | 8/2011 | Rinerson et al. | |
| 8,139,409 B2 | 3/2012 | Chevallier et al. | |
| 8,187,936 B2 | 5/2012 | Alsmeier et al. | |
| 9,312,307 B2* | 4/2016 | Bateman ............... | H01L 45/146 |
| 2001/0055838 A1 | 12/2001 | Walker et al. | |
| 2003/0003675 A1 | 1/2003 | Hsu | |
| 2004/0109353 A1 | 6/2004 | Matsuoka | |
| 2004/0170040 A1 | 9/2004 | Rinerson et al. | |
| 2005/0269626 A1 | 12/2005 | Forbes | |
| 2006/0131695 A1 | 6/2006 | Kuekes et al. | |
| 2006/0171200 A1 | 8/2006 | Rinerson et al. | |
| 2007/0252201 A1 | 11/2007 | Kito et al. | |
| 2007/0273042 A1 | 11/2007 | Kuhn et al. | |
| 2008/0068875 A1 | 3/2008 | Choi | |
| 2008/0090401 A1 | 4/2008 | Bratkovski et al. | |
| 2008/0157127 A1 | 7/2008 | Bertin et al. | |
| 2008/0175032 A1 | 7/2008 | Tanaka et al. | |
| 2008/0217600 A1 | 9/2008 | Gidon | |
| 2008/0278989 A1 | 11/2008 | Lee et al. | |
| 2009/0020744 A1 | 1/2009 | Mizukami et al. | |
| 2009/0027976 A1 | 1/2009 | Rinerson et al. | |
| 2009/0154232 A1 | 6/2009 | Norman | |
| 2009/0302315 A1 | 12/2009 | Lee et al. | |
| 2009/0321816 A1 | 12/2009 | Son et al. | |
| 2010/0044666 A1 | 2/2010 | Baek et al. | |
| 2010/0067279 A1 | 3/2010 | Choi | |
| 2010/0073990 A1 | 3/2010 | Siau et al. | |
| 2010/0078759 A1 | 4/2010 | Sekar et al. | |
| 2010/0090188 A1 | 4/2010 | Futatsuyama | |
| 2010/0103724 A1 | 4/2010 | Kim et al. | |
| 2010/0110771 A1 | 5/2010 | Choi | |
| 2010/0134239 A1 | 6/2010 | Wu et al. | |
| 2010/0140685 A1 | 6/2010 | Kang et al. | |
| 2010/0155686 A1 | 6/2010 | Bratkovski et al. | |
| 2010/0155722 A1 | 6/2010 | Meyer | |
| 2010/0157658 A1 | 6/2010 | Schloss et al. | |
| 2010/0159641 A1 | 6/2010 | Rinerson et al. | |
| 2010/0159688 A1 | 6/2010 | Rinerson et al. | |
| 2010/0161888 A1 | 6/2010 | Eggleston | |
| 2010/0195393 A1 | 8/2010 | Eggleston | |
| 2010/0202188 A1 | 8/2010 | Rinerson et al. | |
| 2010/0219392 A1 | 9/2010 | Awaya et al. | |
| 2010/0259960 A1 | 10/2010 | Samachisa | |
| 2010/0271885 A1 | 10/2010 | Schueuerlein et al. | |
| 2010/0278479 A1 | 11/2010 | Bratkovski et al. | |
| 2010/0290294 A1 | 11/2010 | Siau | |
| 2011/0006275 A1 | 1/2011 | Roelofs et al. | |
| 2011/0017977 A1 | 1/2011 | Bratkovski et al. | |
| 2011/0024710 A1 | 2/2011 | Bratkovoski et al. | |
| 2011/0024716 A1 | 2/2011 | Bratkovski et al. | |
| 2011/0059576 A1 | 3/2011 | Cho et al. | |
| 2011/0063914 A1 | 3/2011 | Mikajiri et al. | |
| 2011/0110149 A1 | 5/2011 | Scheuerlein | |
| 2011/0122676 A1 | 5/2011 | Murooka et al. | |
| 2011/0188281 A1 | 8/2011 | Siau et al. | |
| 2011/0188282 A1 | 8/2011 | Chevallier et al. | |
| 2011/0188283 A1 | 8/2011 | Chevallier et al. | |
| 2011/0188284 A1 | 8/2011 | Chevallier et al. | |
| 2011/0210301 A1 | 9/2011 | Nansei | |
| 2011/0297927 A1 | 12/2011 | Ramaswamy et al. | |
| 2012/0012897 A1 | 1/2012 | Besser et al. | |

(56) References Cited

U.S. PATENT DOCUMENTS

2012/0091413 A1 4/2012 Nguyen et al.
2012/0181596 A1 7/2012 Liu
2012/0248504 A1 10/2012 Liu

OTHER PUBLICATIONS

Baek et al., "Realization of Vertical Resistive Memory (VRRAM) Using Cost Effective 3D Process," IDEM 2011, 31 8.1, pp. 737-740. 4 pages.
Chevallier et al., "A 0.13um 64Mb Multi-Layered Conductive Metal-Oxide Memory," ISSCC 2010/ Session 14/Non-Volatile Memory/ 14.3, pp. 260-261. 2 pages.
Dong et al., "Si/a-Si Core/Shell Nanowires as Nonvolatile Crossbar Switches," Nano Letters 2008, vol. 8, No. 2, pp. 861-391. 6 pages.
HP Datasheet, HP Pavilion dv7-7012nr Entertainment PC, Product No. B2P31UA#ABA, ad embargo date of Apr. 29, 2012. 2 pages.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193. 2 pages.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137. 2 pages.
Kim et al., "Novel Vertical-Stacked-Array-Transistor (VSAT) for Ultra-High-Density and Cost-Effective NAND Flash Memory Devices and SSD (Solid State Drive)," 2009 Symposium on VLSI Technology Digest of Technical Papers, pp. 186-187. 2 pages.
Kim et al., "Multi-Layered Vertical Gate NAND Flash Overcoming Stacking Limit for Terabit Density Storage," 2009 VLSI Symposium on VLSI Technology Digest of Technical Papers, Jun. 16-18, 2009, pp. 188-189. 2 pages.

Krieger, Ju H., "Principle Operation of 3-D Memory Device based on Piezoacousto Properties of Ferroelectric Films," InTech, Dec. 2010, pp. 3-16. 14 pages.
Kwong et al., "Vertical Silicon Nanowire Platform for Low Power Electronics and Clean Energy Applications," May 25, 2011, Journal of Nanotechnology, vol. 2012, Article ID 492121. 21 pages.
Lue et al., "A Highly Scalable 8-Layer 3D Vertical-Gate (VG) TFT Nand Flash Using Junction-Free Buried Channel BE-SONOS Device," 2010 Symposium on VLSI Technology, Jun. 15-17, 2010, pp. 131-132. 2 pages.
Ou et al., "Array Architecture for a Nonvolatile 3-Dimensional Cross-Point Memory," Doctoral Dissertation, Stanford University, Mar. 2010, pp. 1-119. 119 pages.
Ou et al., "Array Architecture for a Nonvolatile 3-Dimensional Cross-Point Resistance-Change Memory," IEEE Journal of Solid-State Circuits, vol. 46, No. 9, Sep. 2011, pp. 2158-2170. 13 pages.
Parrillo, Louis, U.S. Appl. No. 13/250,772, filed Sep. 30, 2011, re Filed Application with Figures. 63 pages.
Siau, Chang, U.S. Appl. No. 13/134,579, filed Jun. 10, 2011, re Filed Application with Figures. 64 pages.
Siau, Chang, U.S. Appl. No. 13/134,589, filed Jun. 10, 2011, re Filed Application with Figures. 73 pages.
Strachan et al., "The switching location of a bipolar memristor: chemical, thermal and structural mapping," Nanotechnology 22 (2011) 254015, pp. 1-6. 7 pages.
Wu, Jian, U.S. Appl. No. 13/250,923, filed Sep. 30, 2011, re Filed Application with Figures. 44 pages.
Yoon et al., "Vertical Cross-point Resistance Change Memory for Ultra-High Density Non-volatile Memory Applications," 2009 Symposium on VLSI Technology Digest of Technical Papers, pp. 26-27. 2 pages.
Zhang et al., "A 3D RRAM Using Stackable 1TXR Memory Cell for High Density Application," IEEE Xplore, Feb. 5, 2010, pp. 917-920. 4 pages.

* cited by examiner

READ OPERATION
$V_R < V_P$
$V_R < |V_E|$

PROGRAM OPERATION
$V_P > V_R$

ERASE OPERATION
(e.g., $V_E = -V_P$ for a bipolar memory cell
or
$V_E > V_P$ for unipolar memory cell)

VERTICAL CROSS-POINT ARRAYS FOR ULTRA-HIGH-DENSITY MEMORY APPLICATIONS

RELATED APPLICATION

The present disclosure is a continuation of Ser. No. 15/633,050, filed Jun. 26, 2017, now U.S. Pat. No. 10,790,334, issued Sep. 29, 2020, which is a continuation of U.S. patent application Ser. No. 15/095,542 filed Apr. 11, 2106, now U.S. Pat. No. 9,691,821, issued on Jun. 27, 2017, which is a continuation of U.S. patent application Ser. No. 14/568,802, filed Dec. 12, 2014, now U.S. Pat. No. 9,312,307, issued Apr. 12, 2016, which is a divisional of U.S. patent application Ser. No. 13/210,292 filed Aug. 15, 2011, now U.S. Pat. No. 8,937,292, issued Jan. 20, 2015, all of which are incorporated herein by reference in their entirety.

FIELD OF THE INVENTION

The present invention relates to memory arrays. More particularly, the present invention relates to back-end-of-the-line (BEOL) ultra-high-density vertical cross-point arrays (VCPAs) including two-terminal memory cells.

BACKGROUND

The availability of low-cost flash memory has been a major facilitator in the widespread proliferation of portable electronic devices such as smart phones, personal digital assistants, tablet and notebook computers, digital cameras, digital audio players, etc. It has also allowed the production of low-cost, flash-based solid-state drives (SSDs) which provide long-term persistent storage, similar to traditional hard disk drives (HDDs) but without the need for any moving parts. Flash memory is non-volatile, meaning that it retains its stored information even when not powered. It is also electrically erasable and reprogrammable, light-weight and durable, and requires no moving parts. All of these attributes lend well for use in portable electronic devices.

To satisfy demand for higher capacity flash memory while keeping manufacturing costs low, flash memory manufacturers have resorted to process scaling techniques in which the memory cells that make up flash memory—known as "floating gate transistors"—are fabricated with smaller dimensions. By scaling down (i.e., "shrinking") the dimensions of the individual floating gate transistors, higher capacity flash memory can be produced. Over the years, process scaling has proved to be remarkably successful, reducing the minimum feature size of floating gate transistors from around 1 micron (1,000 nanometers) in the early 1990s to around 25 nanometers today. However, the ability to scale down further is impeded by diffraction limits of the photolithography processes used in fabricating the floating gate transistors and by short channel effects and memory retention problems that arise when floating gate transistors are scaled down to nanometer dimensions.

Various alternative non-volatile memory technologies have been proposed to replace floating gate transistor memory cells, including phase-change memory cells, in which thermal processes are used to control amorphous and crystalline phase transitions in a chalcogenide; magnetoresistive memory cells, in which magnetizations of ferromagnetic films are used to inhibit or allow electron tunneling through intermediate insulating films; and resistive change memory cells, in which electric fields are used to control ionic transport and electrochemical redox reactions in transition metal oxides. Some of these alternative non-volatile memory technologies have shown great promise. However, various challenges to integrating the memory cells in high-density memory arrays remain. To compete with existing flash memory, memory cell densities of non-volatile memory technologies must rival and preferably exceed state-of-the-art flash memory cell densities.

SUMMARY OF THE INVENTION

Ultra-high-density, high-capacity vertical cross-point arrays (VCPAs) and memory structures incorporating ultra-high-density, high-capacity VCPAs are disclosed. An exemplary VCPA comprises a plurality of horizontal line layers having horizontal lines interleaved with a plurality of vertical lines arranged in rows and columns. Each vertical line comprises a center conductor surrounded by a single or multi-layered memory film. Accordingly, when the vertical lines are interleaved with the horizontal lines, memory cells are integrally formed between the center conductor of each vertical line and each crossing horizontal line. In one exemplary VCPA, the vertical lines are interleaved with the horizontal lines such that a row of vertical lines is positioned between each consecutive pair of horizontal lines in each horizontal line layer. By configuring the horizontal and vertical lines in this manner, a unit memory cell footprint of just $2F^2$ can be realized.

In one embodiment of the invention, the center conductors of the vertical lines of a VCPA are electrically connected to upper and lower bit line layers formed above and below the VCPA. For each column of vertical lines, the center conductors of non-adjacent vertical lines (e.g., "odd" vertical lines) are electrically coupled to a bit line in the upper bit line layer while the center conductors of other non-adjacent vertical lines (e.g., "even" vertical lines) are electrically coupled to a horizontal bit line in said lower bit line layer. The bit lines from both the upper and lower bit line layers are, in turn, electrically connected, by way of vertical vias and/or horizontal interconnects, to bit line select devices of logic circuitry formed in or on an underlying substrate (e.g., a silicon wafer or silicon die).

In another embodiment of the invention, rather than forming bit line select devices in or on the underlying substrate, the select devices (which in a preferred embodiment comprise vertical FETs), are formed above the VCPA, and are configured to selectively electrically couple the center conductors of the vertical lines to bit lines formed above the VCPA. Forming the select devices above the VCPA, instead of in or on the underlying substrate, frees up area for the remaining logic circuitry (e.g., address decoders, sense amplifiers, etc.) which preferably is disposed entirely or mostly under the footprint of the VCPA. For high-capacity VCPAs requiring a large number of select devices, forming the select devices above the VCPA rather than in or on the underlying substrate, further avoids having to resort to advanced lithography and shrink techniques that would otherwise be required to accommodate the increased number of select devices in or on the underlying substrate. In other words, forming the select devices above the VCPA, rather than in or on the underlying substrate, allows VCPAs of higher capacities to be produced without having to sacrifice memory cell density.

There are continuing efforts to improve ultra-high-density Non-Flash non-volatile memory fabrication structures, technology, processes, and circuitry.

BRIEF DESCRIPTION OF THE DRAWINGS

Further details of the above-summarized exemplary embodiment of the invention, as well as details of other embodiments of the invention are described below with respect to the accompanying drawings, in which like reference numbers are used to indicate identical or functionally similar elements, and where.

Figure 1:
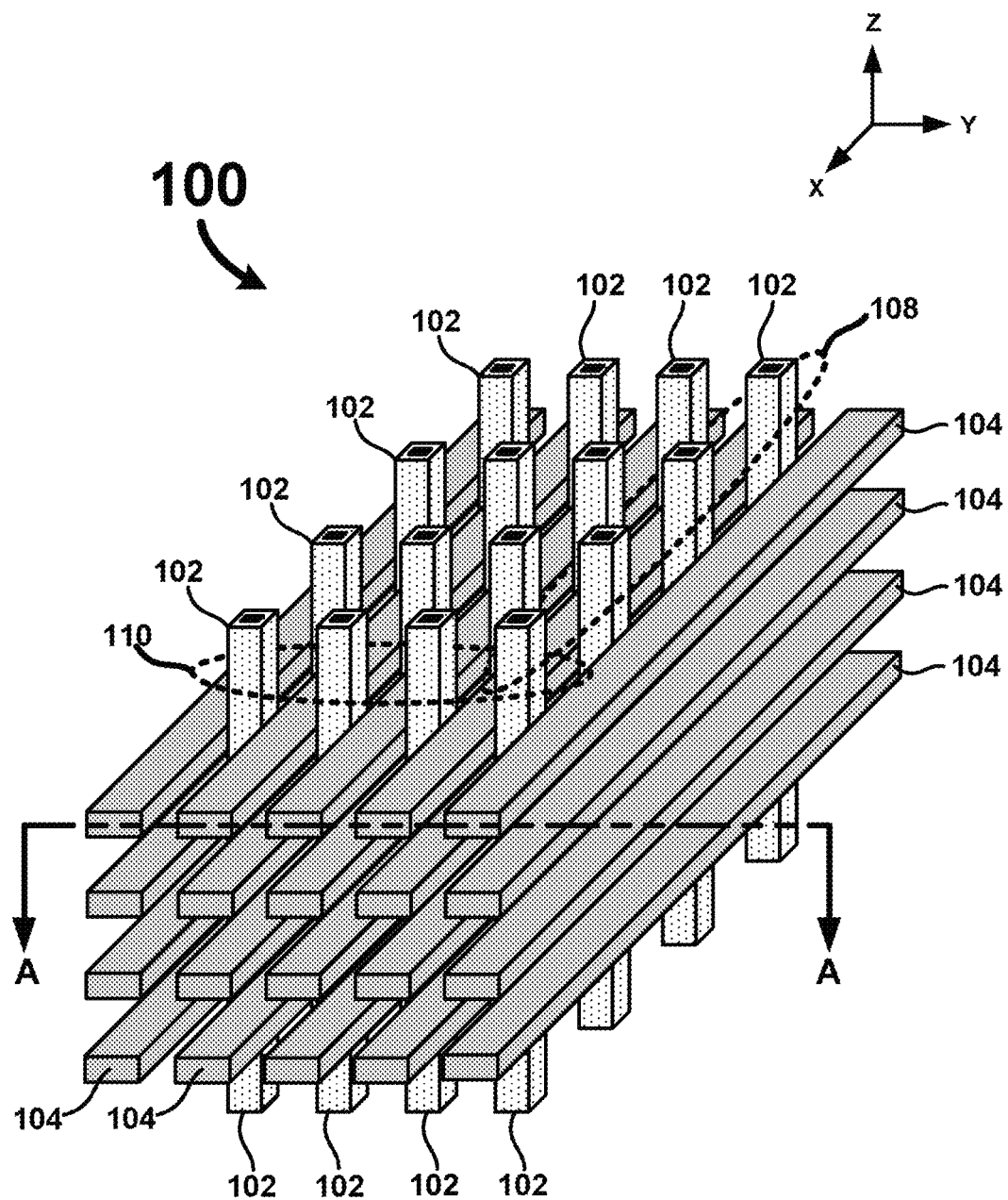
FIG. 1 is a perspective drawing depicting a vertical cross-point array (VCPA) formed from two-terminal memory elements, according to an embodiment of the present invention.

Although the above-described drawings depict various examples of the invention, the invention is not limited by the depicted examples. It is to be understood that, in the drawings, like reference numerals designate like structural elements. Also, it is understood that the drawings are not necessarily to scale.

DETAILED DESCRIPTION

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description. The described fabrication techniques may be varied and are not limited to the examples provided.

Various embodiments or examples may be implemented in numerous ways, including as a system, a process, an apparatus, or a series of program instructions on a non-transitory computer readable medium such as a computer readable storage medium or a computer network where the program instructions are sent over optical, electronic, or wireless communication links. In general, operations of disclosed processes may be performed in an arbitrary order, unless otherwise provided in the claims.

Figure 2:
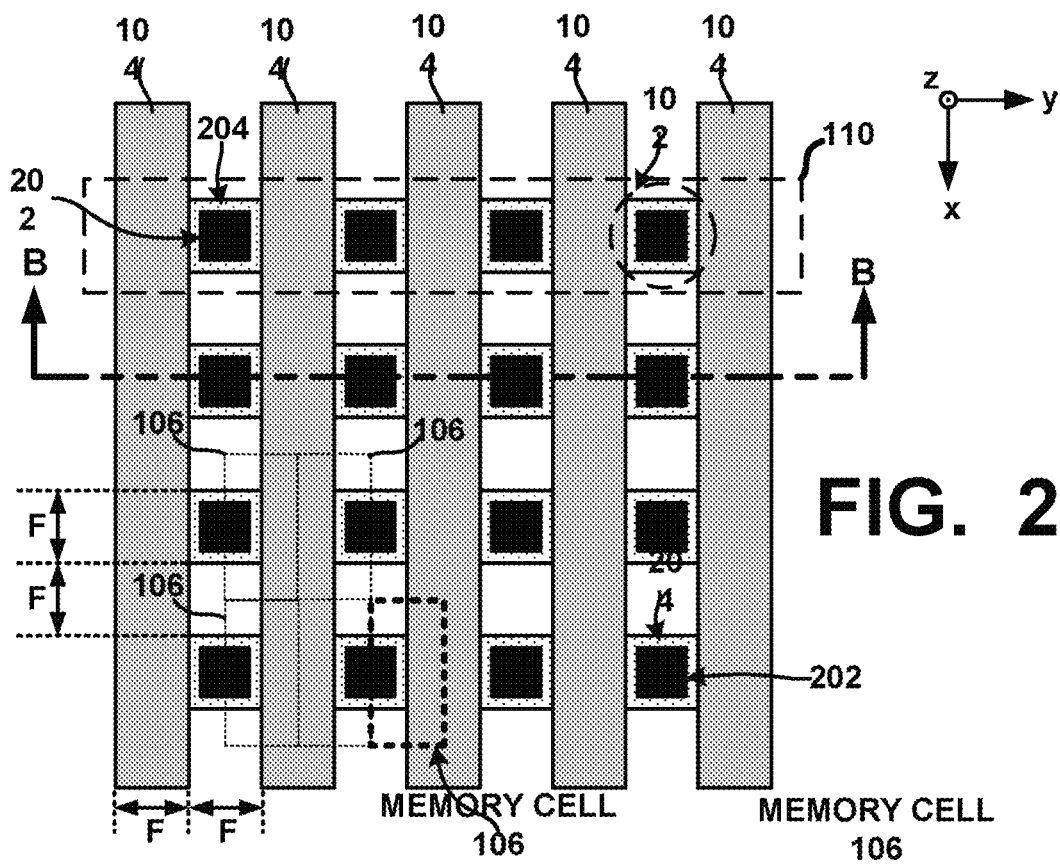
FIG. 2 is a sectional view of the VCPA in FIG. 1 through cutting plane A-A.
Figure 3:
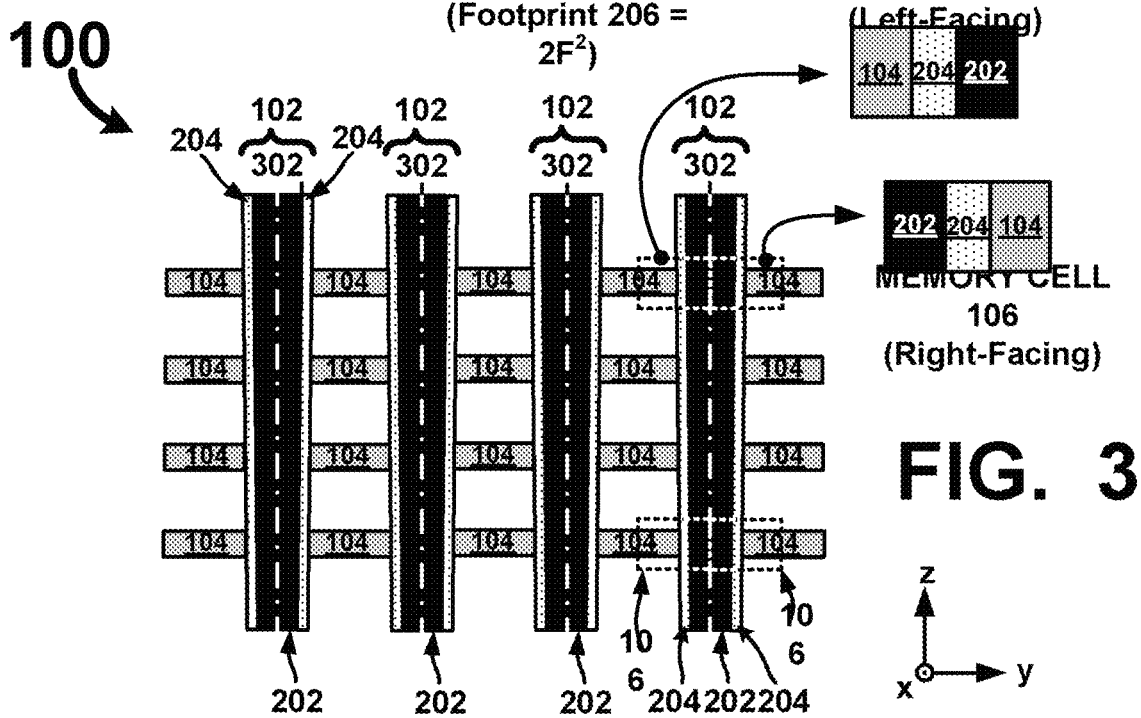
FIG. 3 is a sectional view of the VCPA in FIGS. 1 and 2 through cutting plane B-B.

Referring to FIGS. 1-3 there is shown a vertical cross-point array (VCPA) 100, according to an embodiment of the present invention. The VCPA 100 comprises a plurality of electrically conductive vertical lines 102 extending in the Z-direction, a plurality of horizontal line layers containing a plurality of electrically conductive horizontal lines 104 extending perpendicularly with respect to the vertical lines 102 (e.g., in the x-direction in this example), and a plurality of memory cells 106 (depicted by dashed lines) formed in regions where the vertical and horizontal lines 102 and 104 cross (discussed and illustrated in more detail below). The word memory cell and memory element may be used interchangeably herein to describe the structure of the VCPA where data is stored and the stored data is read from or written to during data operations to the VCPA. The vertical lines 102 are arranged in a grid pattern (e.g., as a plurality of rows 108 (X-direction) and columns 110 (Y-direction) of vertical lines 102 in FIG. 1) and are interleaved with the horizontal lines 104 such that a row 108 of vertical lines 102 is configured between each consecutive pair of horizontal lines 104.

As can be seen more clearly in FIG. 2, which is a sectional view of the VCPA 100 through cutting plane A-A in FIG. 1, and FIG. 3 which is sectional view of the VCPA 100 through cutting plane B-B in FIG. 2, each vertical line 102 comprises an inner (i.e., center) conductor 202 surrounded by (or coated in part (i.e., partially coated) in an alternative embodiment) by at least one memory film 204, which as explained below may comprise, for example, one or more resistive change memory films. The memory film 204 is disposed between the center conductors 202 of the vertical lines 102 and the crossing horizontal lines 104, such that the center conductor 202 of each vertical line 104 serves as a first terminal for memory cells 106 facing left with respect to the centerline 302 of the vertical line 102 (i.e., "left-facing" memory cells) and also as a first terminal for memory cells 106 facing right with respect to the centerline 302 (i.e., "right-facing" memory cells). Each horizontal line 104 that crosses the vertical line 102 serves as second terminal of a memory cell 106 formed between the horizontal line 104 and the center conductor 202 of the vertical line 102. In other words, a memory cell 106 is integrally formed between each horizontal line 104 and the center conductor 202 of each vertical line 102 that the horizontal line 104 crosses. (It should be mentioned that although the memory film 204 in this exemplary embodiment is formed on the outer surfaces of the vertical lines 102, in other embodiments of the invention, the memory film comprises part of or is formed along the edges of the horizontal lines 104, instead.).

In one embodiment of the invention, the VCPA 100 and other VCPAs of the present invention are fabricated using thin-film deposition, etching, patterning, and lithography techniques that are well understood by one skilled in the nanometer and sub-nanometer microelectronics fabrication arts. To maximize memory cell density, the widths of the vertical and horizontal lines 102 and 104 and/or the line spacings are preferably, though not necessarily, fabricated to a have a minimum feature size "F" corresponding to the minimum feature size capability of the lithography equipment used. With a minimum feature size F, the VCPA 100 has a unit memory cell footprint 206 of just $2F^2$, as can be readily observed in the sectional drawing in FIG. 2.

In various embodiments of the invention, the memory cells 106 of the VCPA 100 comprise two-terminal resistive change memory cells that are non-volatile, re-writable, configurable to one or more resistive states, and retain stored data in the absence of electrical power. Write operations to one or more memory cells do not require a prior erase operation or block erase operation, unlike conventional Flash based non-volatile memory (For the purpose of this disclosure and the appended claims, the term "two-terminal" refers to a memory cell having two but no more than two terminals.) The different resistive states of the two-terminal resistive change memory cell are used to represent two or more corresponding memory states, for example a logic "0" and a logic "1" for SLC (e.g., only one-bit of data stored in each memory cell) or multi-level logic states (e.g., at least two-bits of data stored in each cell) such as logic states "00," "01," "10" and "11" for MLC.

Figure 4:
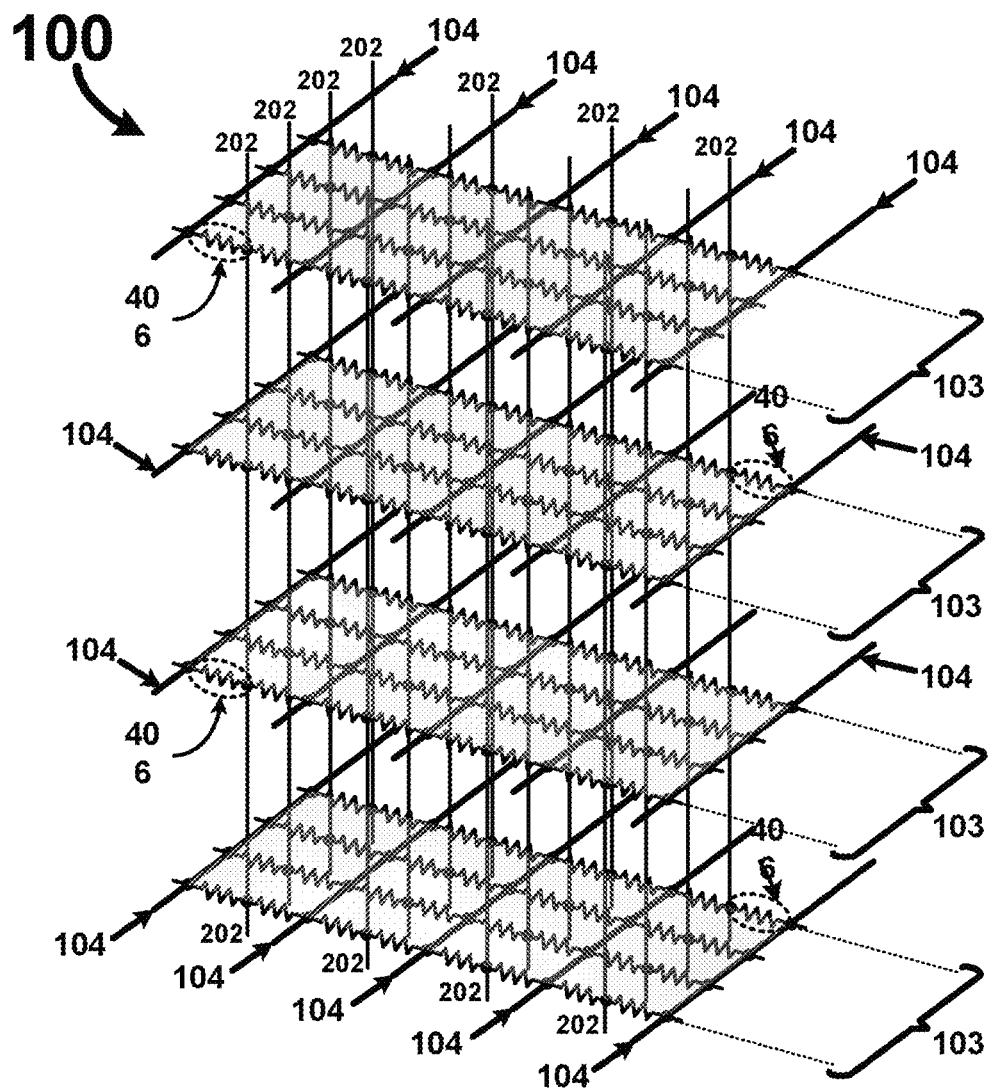
FIG. 4 is a schematic, perspective view of a VCPA formed from two-terminal memory elements, according to an embodiment of the present invention.

FIG. 4 is a schematic, perspective view of the VCPA 100 when configured formed with two-terminal resistive change memory cells 406. Each resistive change memory cell 406 is seen to be positioned between a unique center conductor 202 and horizontal line 104 pair. Further, in each memory layer 103 and each left-to-right rank 110 (see FIGS. 1 and 2) of vertical lines 102 (i.e., each column), a resistive change memory cell 406 is configured between each horizontal line 104 and the center conductor 202 of each adjacent vertical line 102. In other words, memory cell connections are formed on both sides of each horizontal line 104.

It should be mentioned that although the VCPA 100 in FIG. 4 has been described as being formed from resistive change memory cells 406 in this exemplary embodiment, it could alternatively be formed from other types of memory cells, whether based on resistive states or some other memory storing mechanism, whether re-writable or not, and/or whether volatile or non-volatile, or one-time-programmable (OTP). For example, the memory cells 106 may alternatively comprise phase-change (e.g., chalcogenide-based) memory cells, magnetoresistive (i.e., ferromagnetic) memory cells, ferroelectric memory cells, conductive bridge memory cells, carbon nanotube memory cells, fuse-based memory cells, anti-fuse-based memory cells, or other type of memory cells.

It should also be mentioned that whereas the VCPA 100 is shown to include only five horizontal lines 104 per memory layer 103 and only a four-by-four grid (row× column) of vertical lines 102, this is done to ease illustration. In an actual implementation, the VCPA 100 and other VCPAs described herein would typically have many more horizontal lines 104 per memory layer 103 (e.g., hundreds or thousands or more) and many more vertical lines 102 (e.g., hundreds or thousands or more). Further, whereas the VCPA 100 is depicted as having only four memory layers 103 (i.e., a memory "stack" of only four memory layers 103) the memory stack of the VCPA 100 and other VCPAs disclosed herein may be fabricated to have less than four or more than four memory layers 103, and typically would have tens or hundreds of memory layers 103.

Figure 5A:
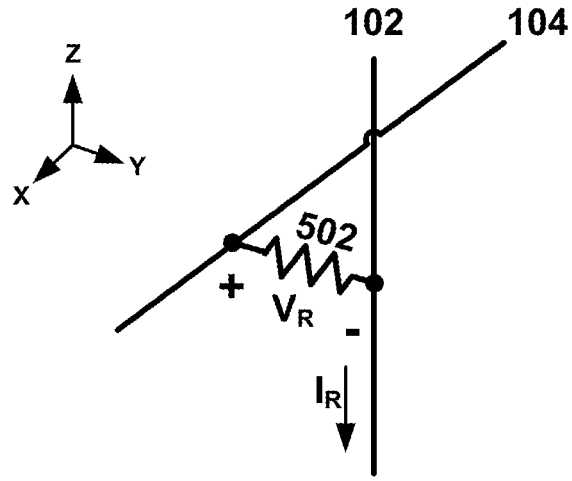
FIGS. 5A-C are schematic drawings depicting how a selected two-terminal memory elements of the VCPA in FIG. 4 is read, programmed, and erased, respectively.
Figure 5B:
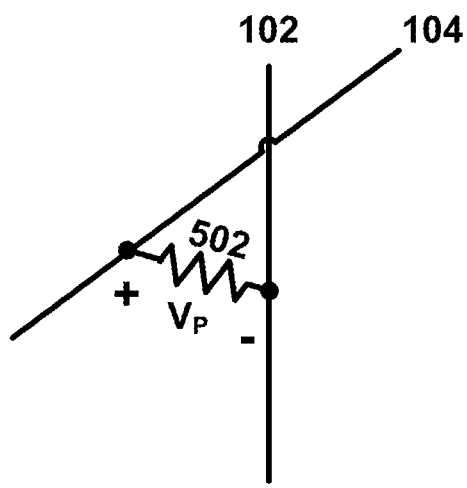
Figure 5C:
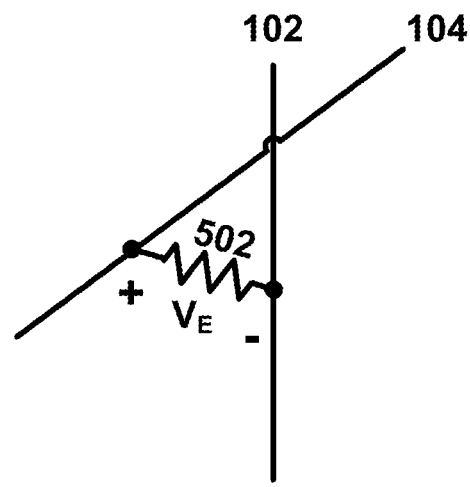

As see in FIG. 4, each resistive change memory cell 406 is positioned between a unique center conductor 202 and horizontal line 104 pair. The unique center conductor 202/ horizontal line 104 pair affords the ability to perform data operations (i.e., read, write, program, erase, and restore operations) on any single resistive change memory cell 406 in the VCPA 100 individually. FIGS. 5A-C are drawings depicting examples of how data operations are performed on a single selected resistive change memory cell 502. As will be understood by those of ordinary skill in the art, the resistive change memory cell 502 is selected by a decoder (not shown) which decodes an address identifying the particular vertical and horizontal lines 102 and 104 in the VCPA 100 between which the selected resistive change memory cell 502 is disposed. In a memory device configured in a FEOL/BEOL structure, the decoders and other circuitry for performing data operations to the VCPA and its associated memory cells are positioned along with active circuitry in the FEOL layer as will be described in greater detail below. To read the selected resistive change memory cell 502 (FIG. 5A), the horizontal line 104 and the center conductor 202 of the vertical line 102 between which the selected resistive change memory cell 502 is disposed are biased so that a read voltage $V_R$ is dropped across the selected resistive change memory cell 502. The read voltage $V_R$ has a magnitude sufficient to generate a measurable read current through the selected resistive change memory cell 502 but not so high as to alter the stored memory state of the memory cell 502. The read current $I_R$ has a value that depends on the resistance of the selected resistive change memory cell 502. Accordingly, when the selected resistive change memory cell 502 is in a high-resistance state, the resulting read current $I_R$ is less than when the selected resistive change memory cell 502 is in a low-resistance state. The different resistive states (i.e., low- or high-resistance states) are therefore indicative of the stored memory state (e.g., a logic "0" or logic "1") of the selected resistive change memory cell 502, i.e., are indicative of whether the selected resistive change memory cell 502 is in a "programmed" state or an "erased" state. The read current $I_R$ or other related signal is directed along the center conductor 202 of the selected vertical line 102 to a sense amplifier or other measuring circuit, which based on the received read current $I_R$ or other related signal electrically determines the stored memory state of the selected resistive change memory cell 502 and outputs a data signal indicative of the stored memory state (e.g., a logic "0" or a logic "1" for SLC or logic values such as "00", "01", "10", and "11" for MLC).

FIG. 5B depicts how a selected memory cell 502 is programmed. In this exemplary embodiment, a "programmed" state is defined as corresponding to a high-resistance state and an "erased" state is been defined as corresponding to a low-resistance state. However, these definitions could be reversed. To program the selected memory cell 502, a program signal $V_P$ is applied across the horizontal line 104 and the center conductor 202 of the vertical line 102 between which the selected resistive change memory cell 502 is disposed. In one embodiment of the invention, the program signal $V_P$ comprises one or more programming pulses having magnitudes greater than the read voltage $V_R$ and sufficient to alter the resistance of the selected resistive change memory cell 502. The magnitude, duration and/or frequency of the programming pulses are controlled to change the resistance of the selected resistive change memory cell 504 to the desired high-resistance, programmed state. For MLC memory cells there may be several distinct program states such as a soft-programmed state and a hard-programmed state, for example.

How a selected resistive change memory cell 502 is erased (FIG. 5C) depends on whether the selected resistive change memory cell 502 has uni-polar or bi-polar switching characteristics. The VCPA 100 may be configured to utilize resistive change memory cells having either type of switching characteristic. For a resistive change memory cell 502 having bipolar switching characteristics, an erase signal $V_E$ comprising one or more erase pulses opposite in polarity to that of the programming pulses of the program signal $V_P$ is applied across the center conductor 202 and horizontal line 104 so that the erase pulses are dropped across the selected resistive change memory cell 502. For a resistive change memory cell 502 having uni-polar switching characteristics, the polarity of the erase pulses are of the same polarity as the programming pulses but have magnitudes greater than the magnitude of the read voltage $V_R$ but different (i.e., less than or greater than) the magnitudes of the programming pulses. Some types of memory cells have both uni-polar and bipolar switching characteristics, in which case erasing may be performed using either a uni-polar or bipolar operation. Whether erasing is performed in a uni-polar or bipolar fashion, the magnitude, duration and/or frequency of the erase pulses are controlled so that the resistance of the selected resistive change memory cell 502 is altered to conform to the desired low-resistance, erased state.

It should be noted that the vertical and horizontal lines associated with "un-selected" memory cells (i.e., those memory cells in the VCPA 100 having no horizontal line or vertical line in common with either the horizontal line or vertical line of a selected memory cell) and the vertical and horizontal lines of "half-selected" and "partially-selected" memory cells (i.e., memory cells that directly share either the same vertical line or same horizontal line as the selected memory cell or are indirectly electrically connected to one of the vertical or horizontal lines of a selected memory cell) that are not shared with the selected memory cell may be grounded or biased to some other potential (e.g., a floating voltage potential) to prevent or inhibit leakage currents from the half-selected or partially-selected memory cells from interfering with the read current $I_R$ read operation. Horizontal and/or vertical lines of un-selected, half-selected and partially-selected memory cells may also be biased to ground or some other potential during write operations (i.e., program and erase operations) to prevent or inhibit the resistive states of un-selected, half-selected and partially-selected memory cells from being altered or disturbed during the write operations. Further details concerning methods that may be used or readily adapted to bias un-selected, half-selected and partially-selected memory cells during data operations are provided in pending U.S. patent application Ser. No. 12/657,911, filed on Jan. 29, 2010 and entitled "Local Bit Lines and Methods of Selecting the Same to Access Memory Elements in Cross-Point Arrays," which is hereby incorporated by reference in its entirety for all purposes.

It should also be mentioned that although data operations have been described as being performed on a single selected resistive change memory cell, data operations may also or alternatively be performed on a plurality of memory cells simultaneously. For example, in other embodiments of the invention, read and program operations may be alternatively performed on a bit, a nibble, a byte, a word, a page, a block or other higher bit basis and erase operations may be performed on a block of memory cells or other smaller group of memory cells simultaneously, similar to as in Flash memory. Further, although programming and erasing has been described as comprising altering the resistance of a selected resistance change memory cell 406 between two distinct resistive states—one representing a logic "0" and the other a logic "1"—in other embodiments of the invention the resistance change memory cells 406 are configured as multi-level cells (MLCs). When configured as MLCs, selected resistive change memory cells 406 are configurable to more than two resistive states, each resistive state corresponding to one of several stored memory states. For example, in one embodiment, each of the resistance change memory cells 406 is configurable to four different resistive states corresponding to four distinct storage states, e.g., a hard programmed state "00", a soft programmed state "01", a hard erased state "11" and a soft erase state "10."

Figure 6:
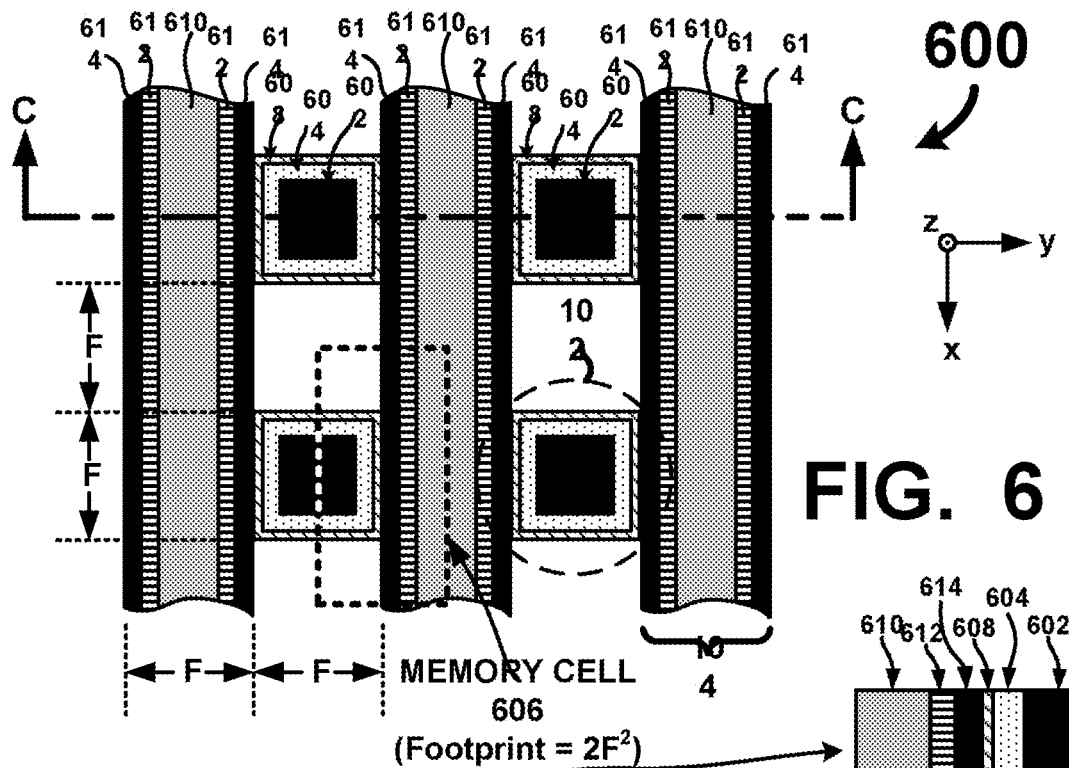
FIG. 6 is a sectional view of a VCPA formed from conductive metal oxide based (CMO-based) memory elements, according to one embodiment of the present invention.
Figure 7:
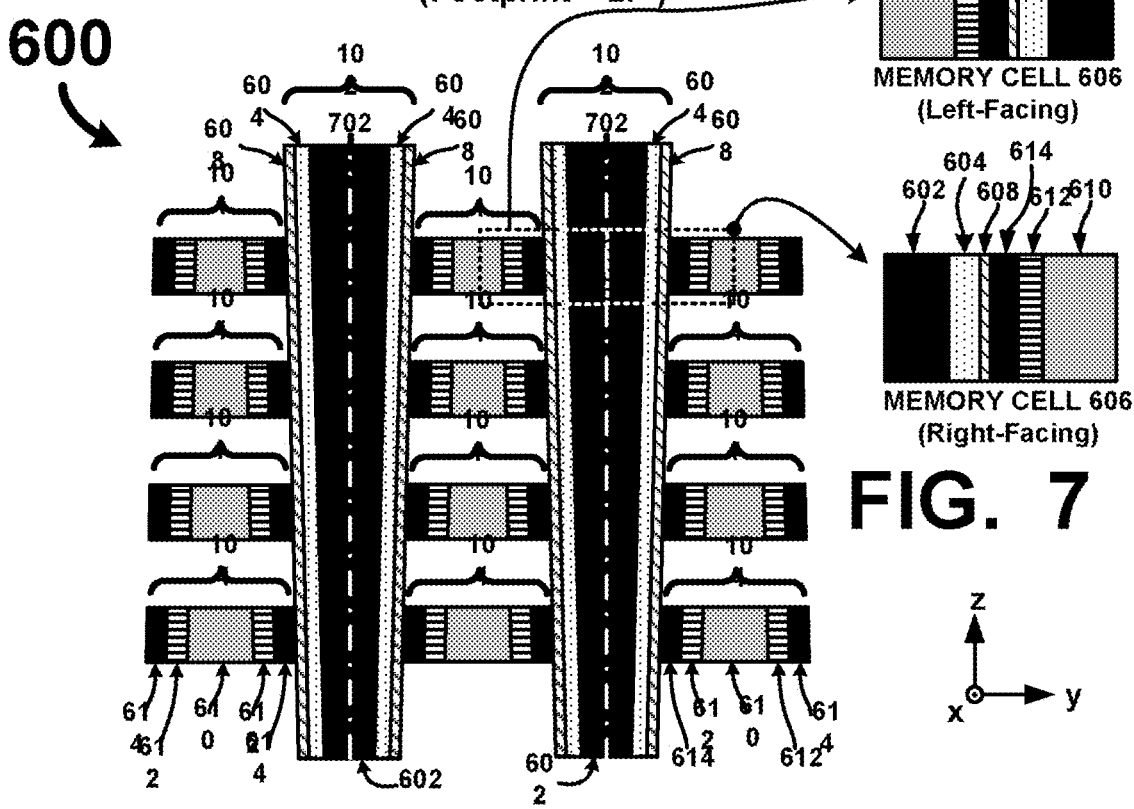
FIG. 7 is a sectional view of the CMO-based VCPA in FIG. 6 through cutting plane C-C.

As discussed above, any suitable type of resistive change memory cell 406 may be used to implement the memory cells 106 of the VCPA 100 described in FIGS. 1-4 above. FIGS. 6 and 7 are sectional drawings similar to the sectional drawings in FIGS. 2 and 3, depicting how conductive metal oxide (CMO) based memory cells 606 (a type of resistive change memory cell) may be used to form a VCPA 600, according to an embodiment of the invention. FIG. 6 is a sectional view of the VCPA 600 in the x-y plane and FIG. 7 is sectional view of the VCPA 600 in through cutting plane C-C in FIG. 6. Each vertical line 102 comprises a center conductor 602 surrounded by an inner CMO layer 604 and an outer insulating metal oxide (IMO) layer 608 (or an inner IMO layer and an outer CMO layer). In an alternative embodiment, instead of comprising part of the vertical lines 102, one or both of the CMO and IMO layers 604 and 608 comprise part of or is/are formed along the edges of the horizontal lines 104.

As depicted in the VCPA 100 in FIG. 1 above, the center conductor 602 of each vertical line 102 is electrically conductive and serves as a first electrode for memory cells 606 associated with that vertical line 102. Each horizontal line 104 comprises a conductive line 610 bounded on both sides by an inner diffusion barrier layer 612 and an outer edge electrode layer 614. The diffusion barrier layers 612 may serve to prevent oxygen diffusion out of the CMO and IMO layers 604 and 608 in applications where the memory cells are configured with CMO and IMO layers. The present invention is not limited to the memory cells depicted herein and the memory cells in FIG. 1 and in other figures of the Drawings are non-limiting examples of memory cells that can optionally be implemented in the VCPA. The horizontal lines 104 are interleaved with the vertical lines 102 such that the edge electrode layers 614 of the horizontal lines 104 are in contact with the IMO layers 604 of the vertical lines 102 at the junctions where the horizontal lines 104 and vertical lines 102 cross. This configuration results in CMO-based memory cells 606 having CMO and IMO layers 604 and 608 disposed between the center conductors 602 of the vertical lines 102 and the edge electrodes 614 of the crossing horizontal lines 104. Similar to as in the VCPA 100 above, the CMO-based memory cells 606 are formed on both sides of the centerline 702 of each vertical line 102, as can best be seen in FIG. 7. In other words, "left-facing" CMO-based memory cells are formed to the left of the centerline 702 and "right-facing" CMO-based memory cells are formed to the right of the centerline 702. Vertical lines 102 are also positioned between every consecutive pair of horizontal lines 104, like the VCPA 100, so that a footprint of $2F^2$ is realized.

The CMO layer 604 of the CMO-based memory cell 606 is an ionic conductor that can have an amorphous, a crystalline structure, a single crystalline, a polycrystalline structure, or a structure that comprises a combination of those structures. It may comprise, but is not limited to, a manganite, a perovskite selected from one or more the following: $PrCaMnO_X$ (PCMO), $LaNiO_X$ (LNO), $SrRuO_X$ (SRO), $LaSrCrO_X$ (LSCrO), $LaCaMnO_X$ (LCMO), $LaSrCaMnO_X$ (LSCMO), $LaSrMnO_X$ (LSMO), $LaSrCoO_X$ (LSCoO), and $LaSrFeO_X$ (LSFeO), where x is nominally 3 for perovskites (e.g., x≤3 for perovskites), or a conductive binary oxide comprised of a binary metal oxide having the form $A_XO_Y$, where A represents a metal and O represents oxygen. The conductive binary oxide material may optionally be doped (e.g., with niobium Nb, fluorine F, and/or nitrogen N) to obtain the desired conductive properties for the CMO.

The IMO layer 608 of the CMO-based memory cell 606 is an ionic conductor and an electronic insulator and serves as an electrolytic tunnel barrier that is permeable to oxygen ions during write (i.e., program and erase) operations. It may comprise, but is not limited to, one or more of the following materials: high-k dielectric materials, rare earth oxides, rare earth metal oxides, yttria-stabilized zirconium (YSZ), zirconia ($ZrO_X$), yttrium oxide ($YO_X$), erbium oxide ($ErO_X$), gadolinium oxide ($GdO_X$), lanthanum aluminum oxide ($LaAlO_X$), and hafnium oxide ($HfO_X$), aluminum oxide ($AlO_X$), silicon oxide ($SiO_X$), ceria oxide ($CeO_X$), and equivalent materials. Further details concerning the materials and properties of CMO-based memory cells are described in U.S. patent application Ser. No. 11/095,026, filed Mar. 30, 2005, and published as U.S. Pub. No. 2006/0171200, and entitled "Memory Using Mixed Valence Conductive Oxides", U.S. patent application Ser. No. 12/653,836, filed Dec. 18, 2009, and published as U.S. Pub. No. 2010/0157658, and entitled "Conductive Metal Oxide Structures In Non-Volatile Re-Writable Memory Devices"; U.S. patent application Ser. No. 11/881,496, filed Jul. 26, 2007, now U.S. Pat. No. 7,897,951, and entitled "Continuous Plane Of Thin-Film Materials for A Two-Terminal Cross-Point Memory;" and U.S. Pat. No. 8,003,551, issued on Aug. 23, 2011, and entitled "Memory Cell Formation Using Ion Implant Isolated Conductive Metal Oxide," all of which are hereby incorporated by reference in their entirety and for all purposes.

Figure 8A:
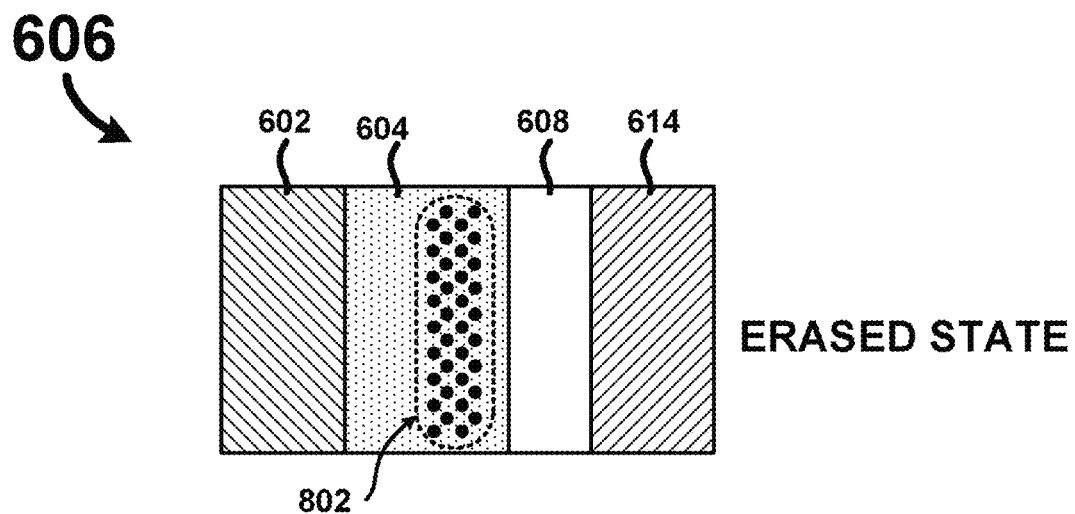
FIGS. 8A and 8B are sectional drawings of a CMO-based memory element of the VCPA in FIG. 6 configured in an erased state and a programmed state, respectively.
Figure 8B:
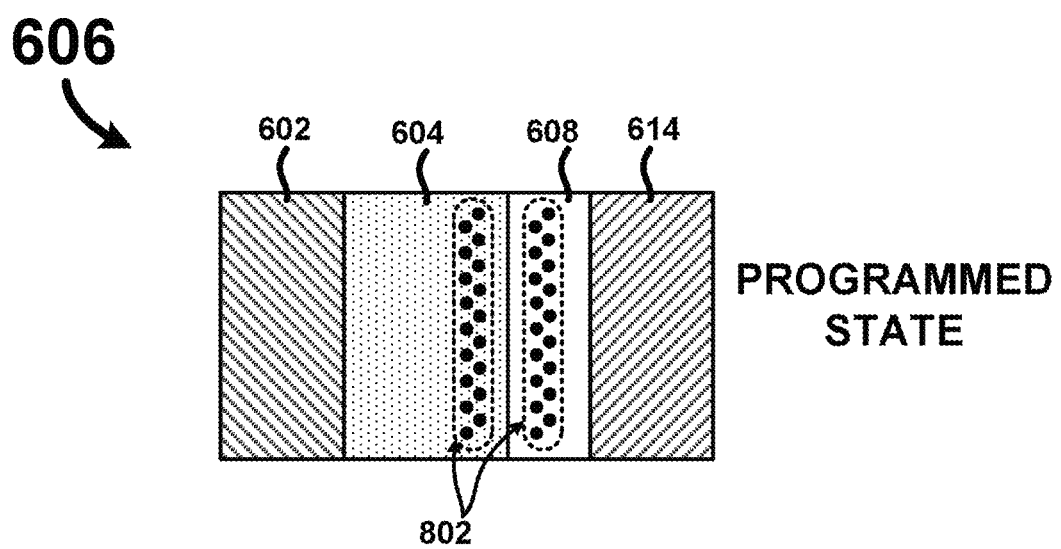

FIGS. 8A and 8B are cross-sectional drawings depicting the CMO-based memory cell 606 in an erased state and a programmed state, respectively. When in an erased state (FIG. 8A), negatively-charged oxygen ions, i.e., oxygen anions 802 (denoted by the small black-filled circles) are mostly concentrated in the CMO layer 604, and the CMO-based memory cell 606 exhibits a low resistance to current (i.e., is in a low-resistance state). Conversely, when in a programmed state (FIG. 8B), the negatively-charged oxygen ions 802 are distributed more evenly between the CMO and IMO layers 604 and 608, and the CMO-based memory cell 606 exhibits a high resistance to current (i.e., is in a high-resistance state).

Figure 9:
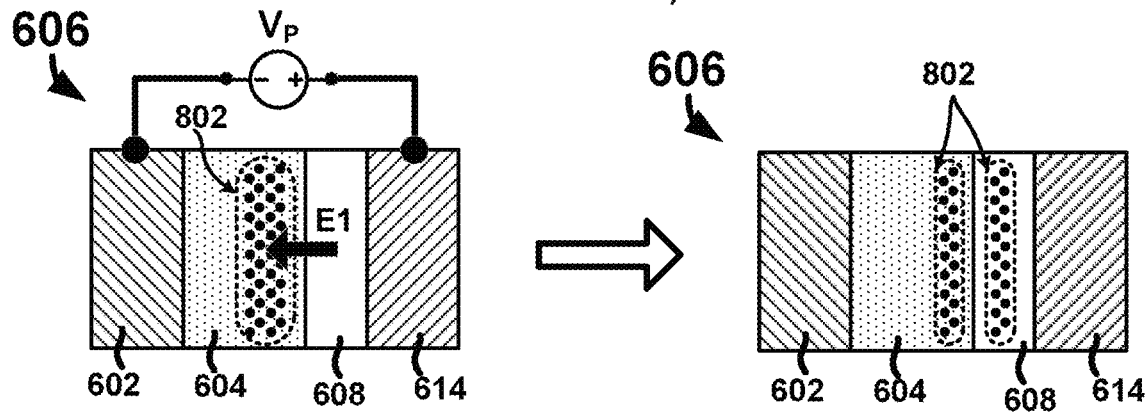
FIG. 9 depicts how a selected CMO-based memory element of the VCPA in FIG. 6 is programmed during a programming operation.
Figure 10:
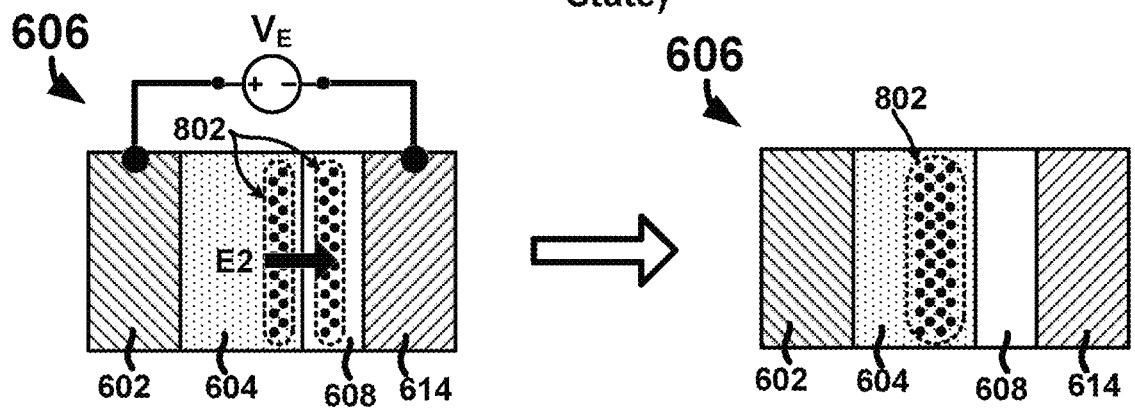
FIG. 10 depicts how a selected CMO-based memory element of the VCPA in FIG. 6 is erased during an erase operation.

FIGS. 9 and 10 are drawings depicting how the CMO-based memory cell 606 is programmed and erased. During a programming operation (FIG. 9), a program voltage signal $V_P$ comprising one or more programming pulses is applied across the electrodes 602 and 614 of the selected CMO-based memory cell 606. The programming pulse(s) generates an electric field E1 in the CMO and IMO layers 604 and 608, forcing a portion of the negatively-charged oxygen ions 802 in the CMO layer 604 to migrate into the IMO layer 608 and cause the CMO-based memory cell 606 to conform to a high-resistance, programmed state. (Note that when configured in the VCPA 600 in FIGS. 6-7, the program voltage signal $V_P$ is applied via the horizontal line 104 and the center conductor 602 of the vertical line 102 between which the memory cell 606 is disposed, similar to as described above in reference to FIG. 5B. Erase and read voltage signals $V_E$ and $V_R$ are also applied to a selected CMO-based memory cell 606 via the memory cell's respective center conductors 606 and horizontal lines 104 during erase and read operations (discussed below), similar to as shown in FIGS. 5C and 5A above.)

During the erase operation (FIG. 10), an erase voltage signal $V_E$ comprising one or more erase pulses having a polarity opposite that of the program pulses of the program voltage signal $V_P$ (note that the CMO-based memory cells 606 have bipolar switching characteristics) is applied across the electrodes 602 and 614 of the selected CMO-based memory cell 606. The erase pulses generates an electric field E2, opposite in polarity to that of E1, in the CMO and IMO layers 604 and 608, which forces a portion of the negatively-charged oxygen ions 802 to migrate back out of the IMO layer 608 into the CMO layer 604, resulting in the CMO-based memory cell 606 conforming to a low-resistance, erased state.

Once the CMO-based memory cell 606 has been programmed or erased to either resistive state, it maintains that resistive state, even in the absence of electrical power. No battery backup or other type of power source, such as a capacitor or the like, is necessary to retain the stored data. In other words, the CMO-based memory cell 606 is non-volatile. In addition to being non-volatile, the CMO-based memory cell 606 is re-writable, meaning that it can be programmed and erased over and over again.

The exemplary programming and erase operations describe above demonstrate how the CMO-based memory cell 606 is configurable between two non-volatile resistive states, one used to represent a logic "0" and the other to represent a logic "1." In other embodiments of the invention in which CMO-based memory cells 606 are used, the CMO-based memory cells 606 are configured to operate as MLCs having more than two resistive states. For example, in one MLC embodiment, each CMO-based memory cell 606 is configurable to four distinct resistive states, with each resistive state corresponding to one of four logic states "00," "01," "10," and "11." Different magnitudes and polarities of program and erase voltages of one or more pulses having varying pulse shapes and durations can be used to perform the write operations on the CMO-based memory cell 606 configured for MLC.

The stored memory state of a selected CMO-based memory cell 606 is read by applying a read voltage $V_R$ across its electrodes 602 and 614, similar to as described in reference to FIG. 5A above. The read voltage $V_R$ has a magnitude sufficient to generate a measurable read current $I_R$ through the CMO-based memory cell 606 but not so high as to cause substantial migration (e.g., transport) of mobile oxygen ions between the CMO and IMO layers 604 and 608. The magnitude of the resulting read current $I_R$ is dependent upon the resistive state of the CMO-based memory cell 606 and a magnitude of the read voltage $V_R$. Consequently, when the CMO-based memory cell 606 is in a high-resistance state, the read current $I_R$ that results is lower than when the CMO-based memory cell 606 is in a low-resistance state. The read current $I_R$ is therefore indicative of the stored memory state (i.e., logic "0" or logic "1") of the CMO-based memory cell 606. When the CMO-based memory cell 606 is configured in the VCPA 600, the read current $I_R$ or other related signal is directed along the center conductor 602 of the vertical line 102 to a sense amplifier or other measuring circuit, which electrically determines the stored memory state of the selected memory cell 606 based on the received signal.

Figure 8C:
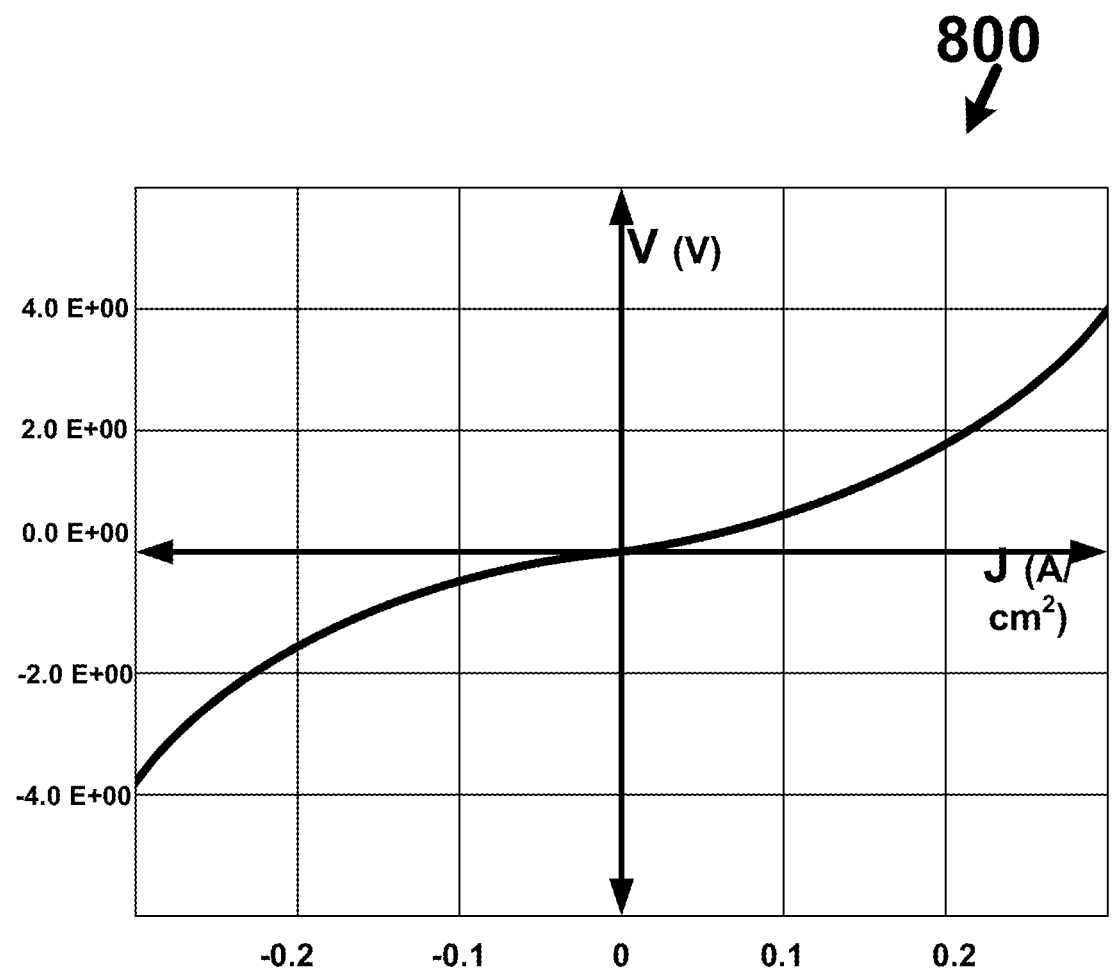
FIG. 8C depicts one example of a graphical representation of a non-linear I-V characteristic for a discrete memory element having integral selectivity.

FIG. 8C graphically depicts one example of a non-linear I-V characteristic 800 for a discrete re-writable non-volatile two-terminal resistive memory element (e.g., memory element 106, 406, 606, or non-CMO/IMO based memory elements) having integral selectivity due to its non-linear I-V characteristics and the non-linear I-V characteristic is maintained regardless of the value of the data stored in the memory cell, that is the I-V characteristic of the memory element does not change from non-linear to linear as a function of the resistive state stored in the memory element. Therefore, the non-linear I-V characteristic of the memory element is non-linear for all values of stored data (e.g., resistive states). Voltage V applied across the memory element is plotted on the Y-axis and current density J through the memory element is plotted on the X-axis. Here, current through the memory element is a non-linear function of the applied voltage across the memory element. Accordingly, when voltages for data operations (e.g., read and write voltages) are applied across the memory element, current flow through the memory element does not significantly increase until after a voltage magnitude of about 2.0V (e.g., at ≈0.2 A/cm$^2$) is reached (e.g., a read voltage of about 2.0V across the memory element). An approximate doubling of the voltage magnitude to about 4.0V does not double the current flow and results in a current flow of ≈0.3 A/cm$^2$. The graph depicted is only an example and actual non-linear I-V characteristics will be application dependent and will depend on factors including but not limited to an area of the memory element (e.g., area determines the current density J) and the thin-film materials used in the memory element, just to name a few. The area of the memory element will be application dependent. Here, the non-linear I-V characteristic of the discrete memory element applies to both positive and negative values of applied voltage as depicted by the non-linear I-V curves in the two quadrants of the non-linear I-V characteristic 800. One advantage of a discrete re-writable non-volatile two-terminal resistive memory element that has integral selectivity due to a non-linear I-V characteristic is that when the memory element is half-selected (e.g., one-half of the magnitude of a read voltage or a write voltage is applied across the memory element) during a data operation to a selected memory cell(s), the non-linear I-V characteristic is operative as an integral quasi-selection device and current flow through the memory element is reduced compared to a memory cell with a linear I-V characteristic. Therefore, a non-linear I-V characteristic can reduce data disturbs to the value of the resistive state stored in the memory element when the memory element is un-selected or is half-selected. Herein, the term "discrete" means that the memory cell or memory element does not include a selection device such as one or more transistors (e.g., 1T-1R or 2T-1R), diodes (1D-1R or 2D-1R), or a non-ohmic device (NOD) (e.g., a MIM device), for example. The non-linear I-V characteristic of the discrete memory element is solely due to the memory element itself when it is stimulated by a voltage or current. The non-linear I-V characteristic 800 of FIG. 8C is just one example of a non-linear I-V curve and the present invention is not limited to the example of FIG. 8C and other curves having different shapes than those depicted may be implemented. In other embodiments, the memory element (e.g., memory element 106, 406, 606, or non-CMO/IMO based memory elements) may have a non-linear I-V characteristic for some values of the resistive state stored in the memory element and a linear I-V characteristic for other values of the resistive state stored in the memory element.

Figure 11:
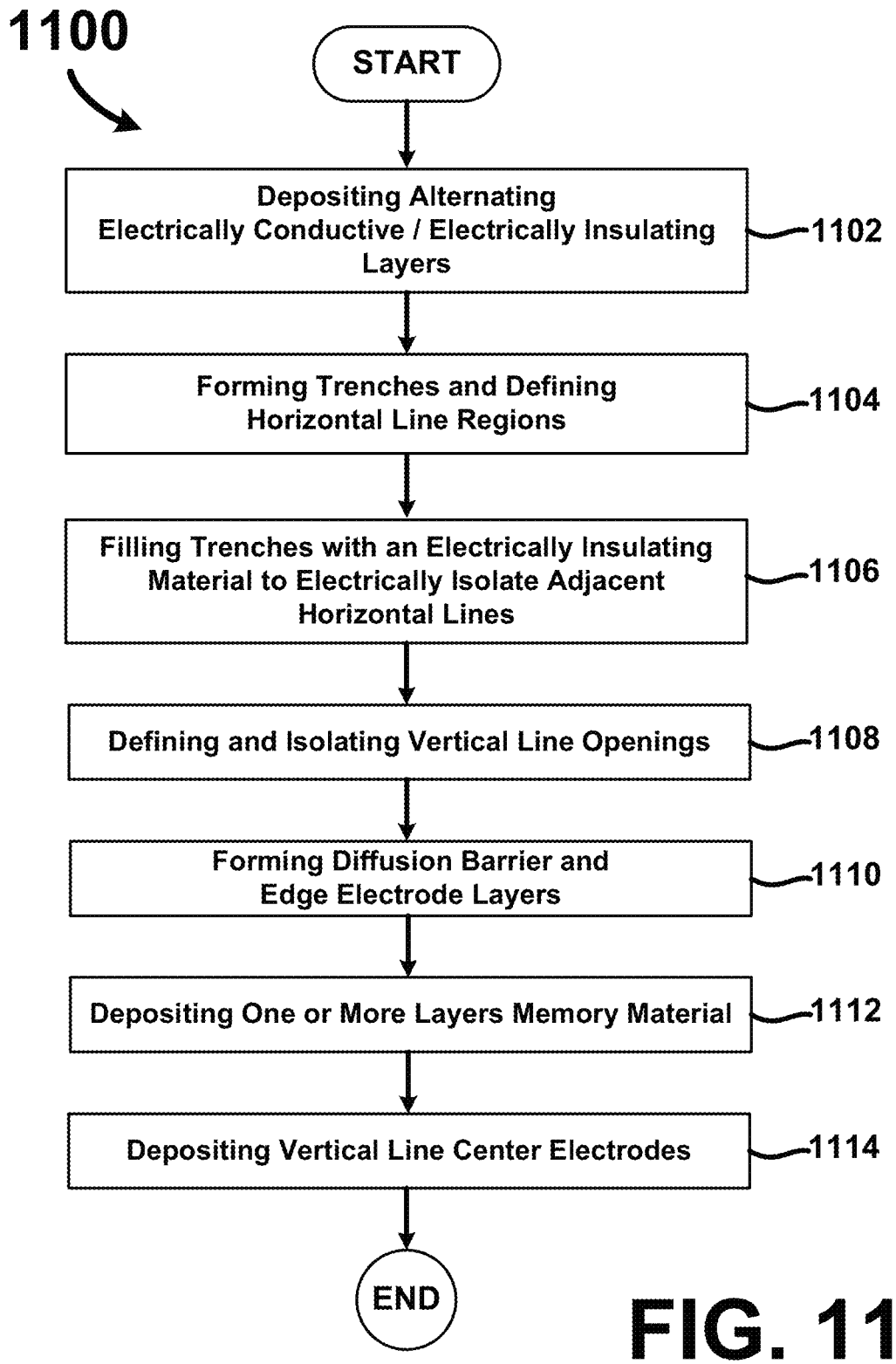
FIG. 11 is a flowchart depicting an exemplary fabrication method that may be used to fabricate a VCPA like or similar to the VCPA in FIGS. 6 and 7.

Turning now to FIG. 11, there is shown a flow chart depicting an exemplary fabrication method 1100 that may be used to fabricate a VCPA 1200 similar to the VCPA 600 shown and described above in reference to FIGS. 6 and 7. It should be mentioned that the fabrication method 1100 is but one of several ways in which the VCPA 600 can be manufactured and only salient steps of the method 1100 are shown. Further, the various steps of the fabrication method 1100 need not necessarily be performed in the order shown.

Figure 12A:
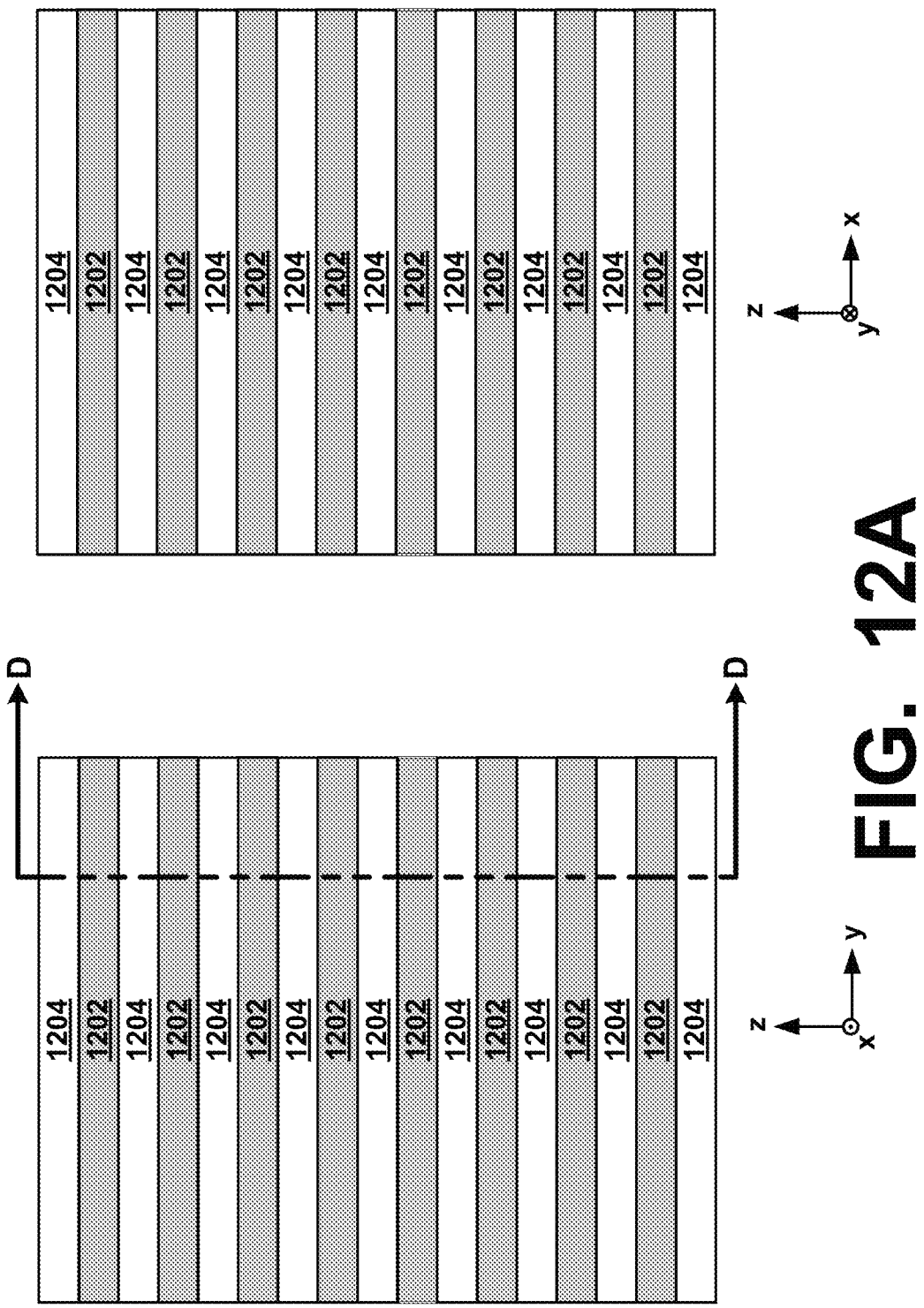
FIGS. 12A-H are sectional drawings of a VCPA, like or similar to the VCPA in FIGS. 6 and 7, at various stages in the fabrication method depicted in FIG. 11.

At a stage 1102 of the fabrication method 1100, alternating layers of blanket electrically conductive (e.g., a metal or a metal alloy) and electrically insulating materials (e.g., a dielectric material) 1202 and 1204 (e.g., 50-100 nm in thickness each) are formed on a substrate. The substrate (not shown) is a semiconductor substrate or a substrate having a semiconductor layer formed thereon within which logic circuitry used to control and perform data operations on memory cells 606 of the VCPA 100 has been previously fabricated FEOL. The conducting layers 1202 comprise a metal or other electrically conductive material. They are deposited using physical vapor deposition (PVD) (evaporation, sputtering or ablation of the film-forming material), chemical vapor deposition (CVD), in which gases, evaporating liquids, or chemically gasified solids are used as the source material, atomic layer deposition (ALD) or a plating technique such as, for example, electroless plating. The insulating layers 1204, which may comprise silicon dioxide ($SiO_2$), silicon nitride ($SiN_x$), a silicate glass (doped or un-doped) or other suitable dielectric material such as a low dielectric constant (i.e., low-k) material, are deposited using CVD, for example from a TEOS (tetraethylorthosilicate) source, or by vapor phase epitaxy (VPE). The partially completed VCPA structure following forming the alternating conducting and insulating layers 1202 and 1204 is shown in FIG. 12A, which includes both y-z plane and x-z plane (through cutting plane D-D of the y-z plane) sectional views of the partially completed VCPA structure.

Figure 12B:
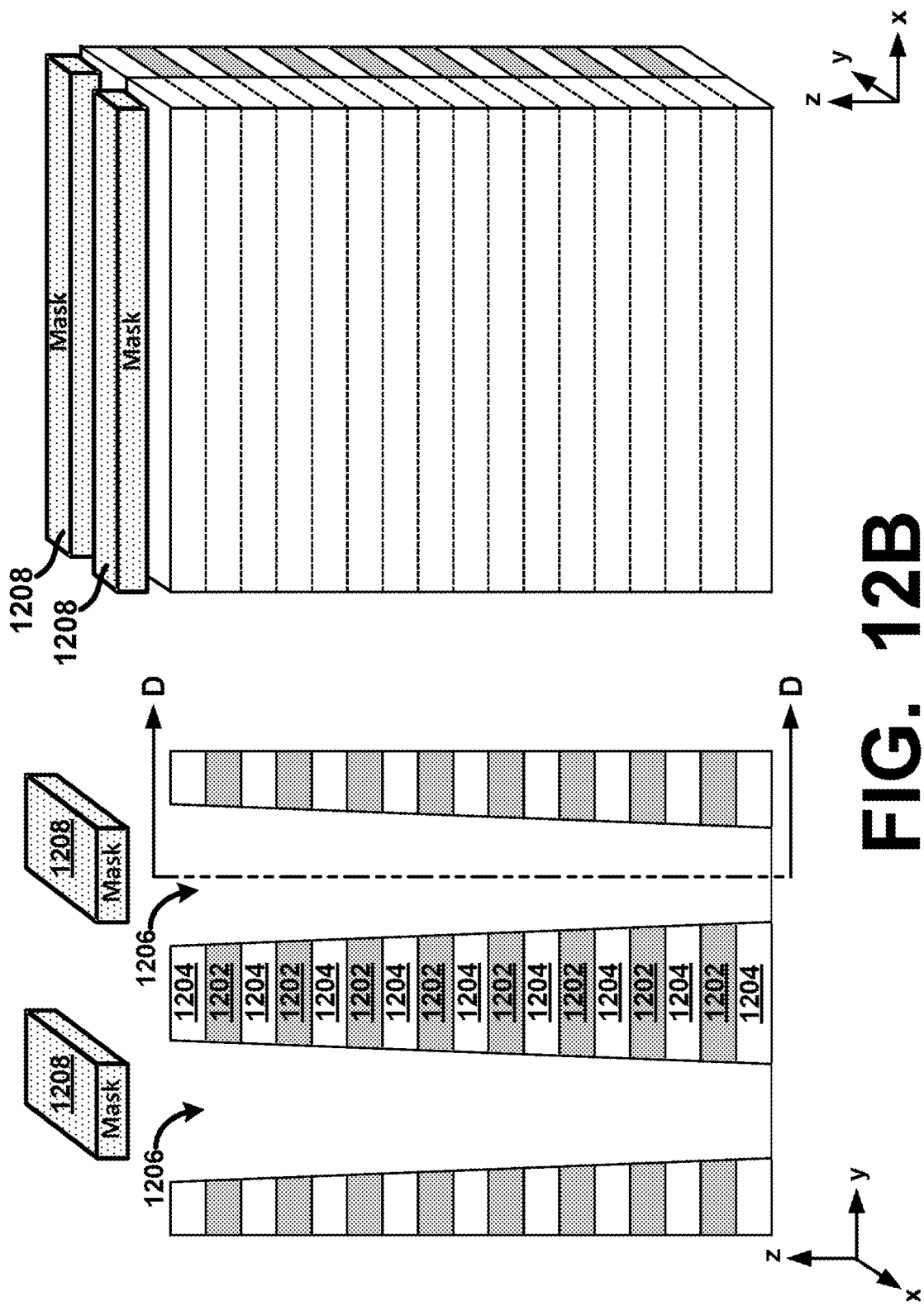

At a stage 1104, trenches 1206 are formed through the conducting and insulating layers 1202 and 1204, as illustrated in FIG. 12B. The trenches 1206 extend in the x-direction and may be formed in various ways. In one embodiment of the invention, trench opening patterns are first lithographically defined according to a first mask 1208 and then anisotropically etched using a dry etch process, such as a plasma etch (e.g., a reactive ion etch (RIE)). Etching the trenches 1206 through the conducting and insulating layers 1202 and 1204 also coincidentally forms regions that will eventually define the horizontal lines 104 of the VCPA 1200. The partially completed VCPA structure following step 1104 is shown in FIG. 12B.

At a stage 1106, the trenches 1206 are filled with an electrically isolating material (e.g., a dielectric material) operative to electrically isolate adjacent horizontal lines (e.g., horizontal lines 104) of the VCPA 1200. Suitable dielectric materials include but are not limited to TEOS, silicon dioxide ($SiO_2$), silicon nitride ($SiN_x$), a silicate glass (doped or un-doped) or the like.

Figure 12C:
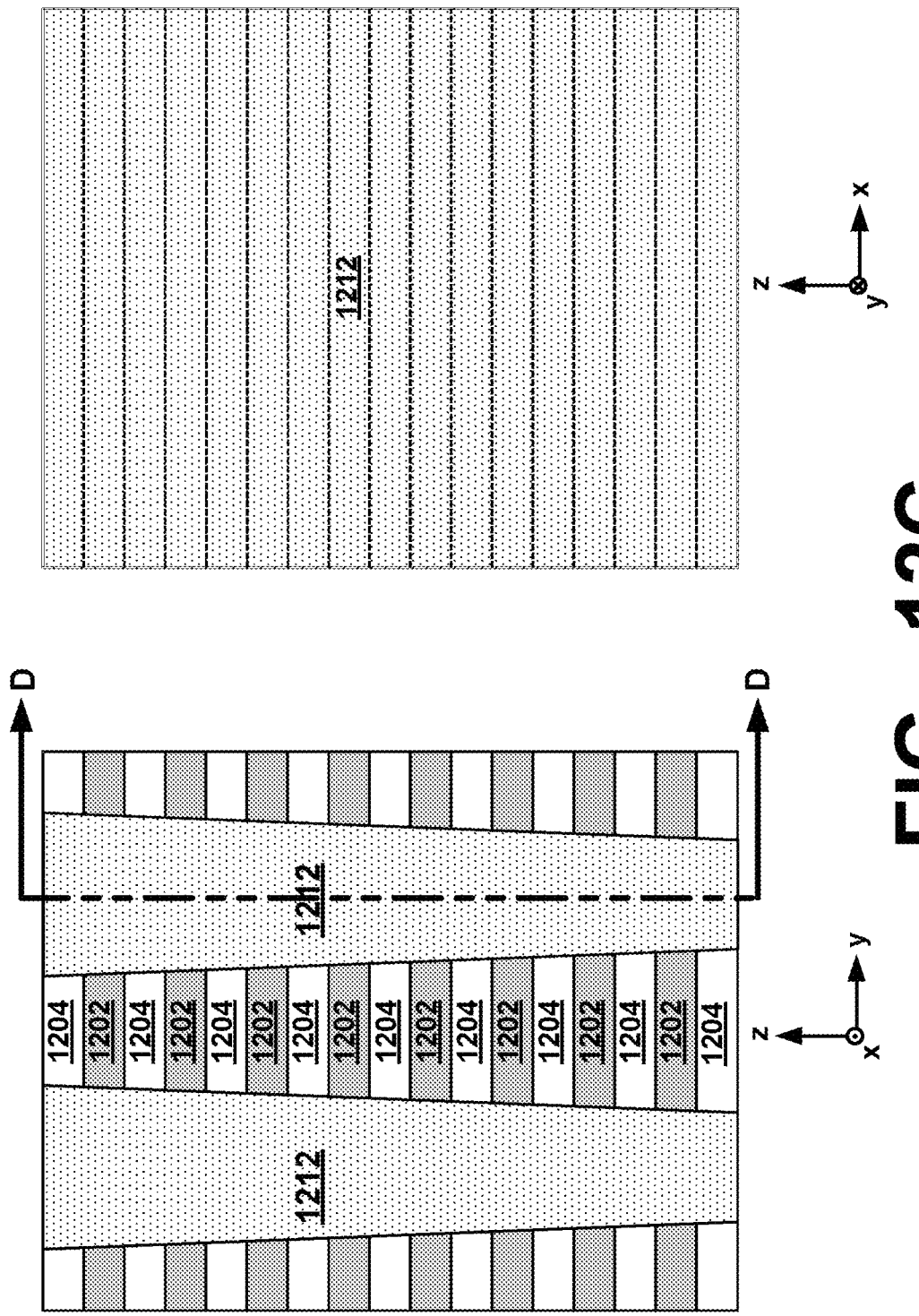

After the trenches 1206 have been formed, at a stage 1108 vertical line openings (i.e., "holes") 1210 defining the outer boundaries of the yet-to-be-manufactured vertical lines 102 of the VCPA 1200 are patterned and formed. In forming the vertical line openings 1210, a second dielectric material 1212 (e.g., silicon nitride—$Si_3N_4$) or other suitable dielectric having a high etch selectivity compared that of the insulating layers 1204 is first deposited in the trenches 1206, as shown in FIG. 12C. Then, a second lithography step, using a second mask 1214 with features perpendicular to those of the first mask 1208, and second etch are performed to form the vertical line openings 1210. The second etch is a selective etch that etches the second dielectric material 1212 according to the pattern produced from the second mask 1214 but does not etch other materials like the dielectric material used for the insulating layers 1204.

Figure 12D:
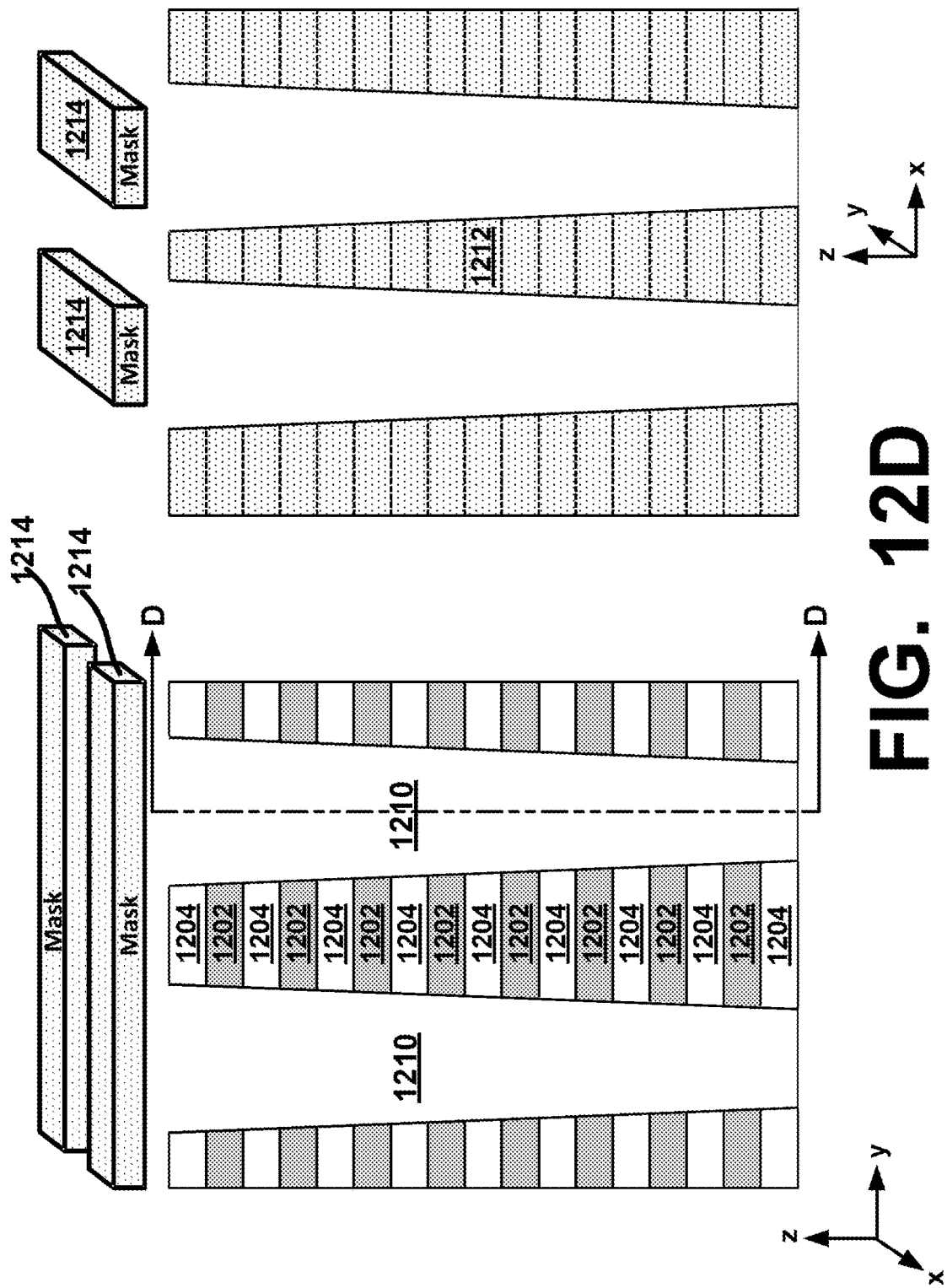
Figure 12E:
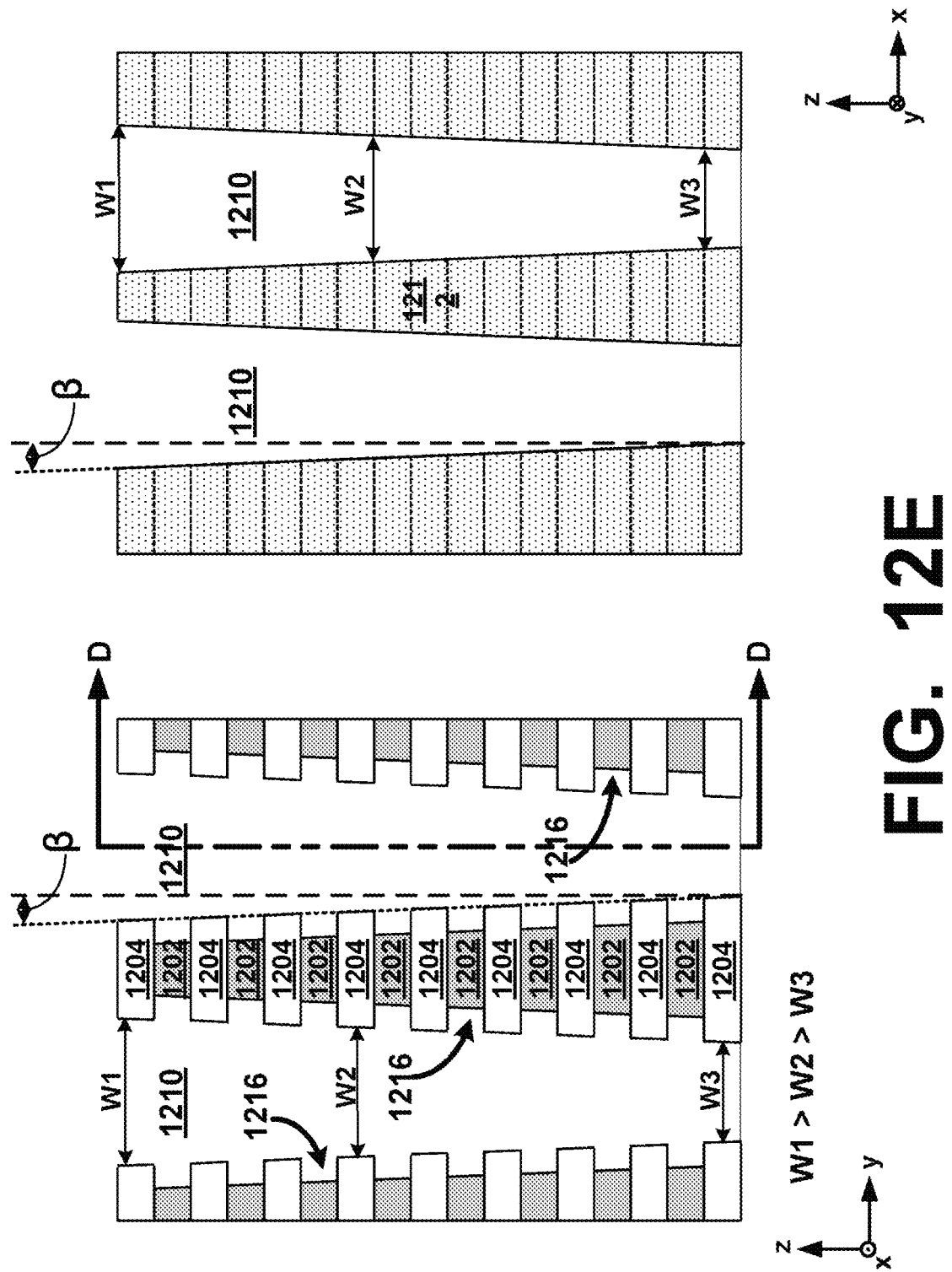
Figure 12F:
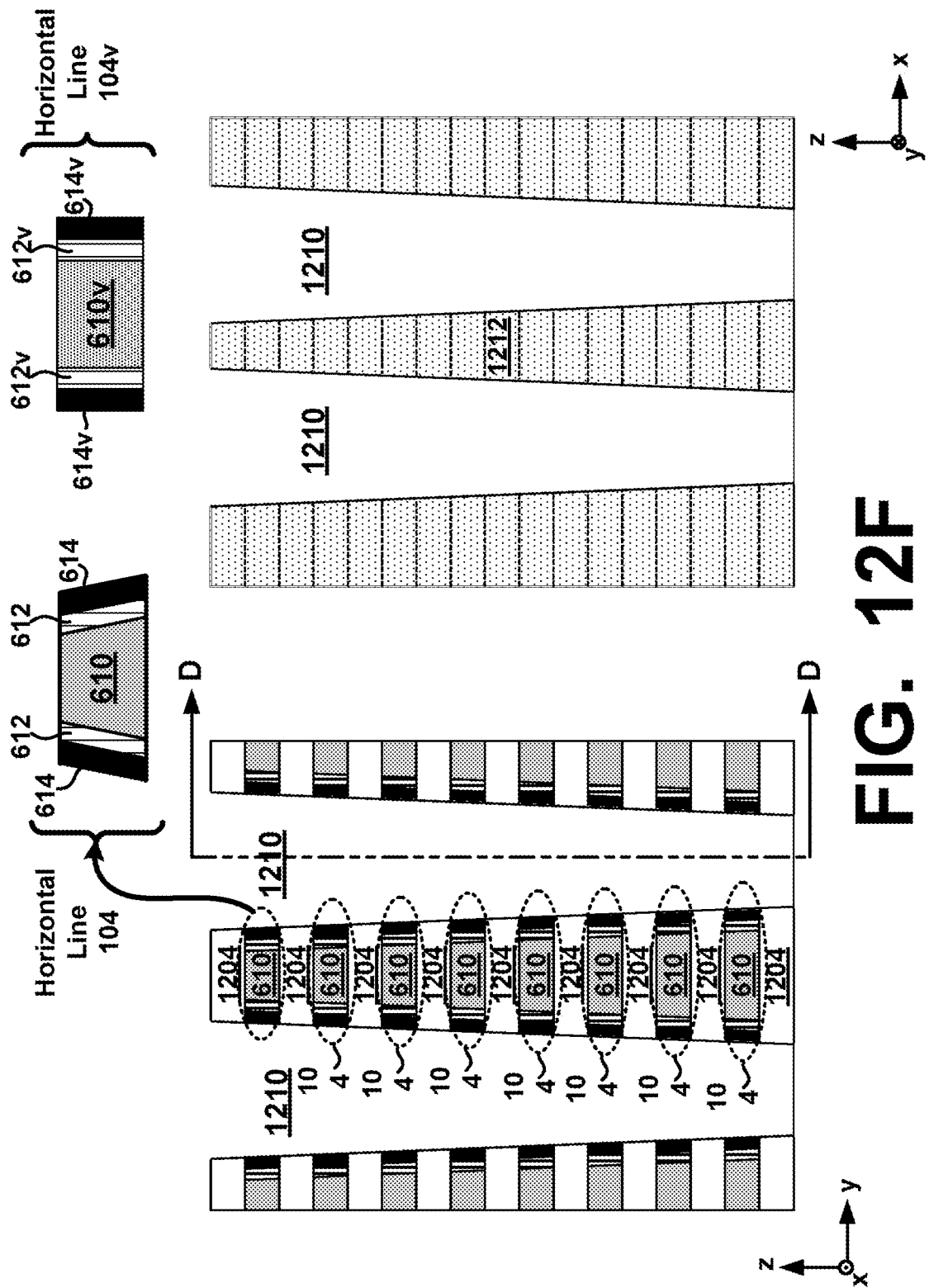

The partially completed VCPA structure following step 1108 is shown in FIG. 12D. It should be noted that the vertical line openings 1210 are not completely vertical (see angle β that depicts deviation from the vertical in FIG. 12E). Therefore, the opening narrows from top to bottom as denoted by widths W1, W2, and W3 in FIG. 12E, such that at the top width W1 is greater than width W2 midway in the opening which is turn is greater than width W3 at the bottom of the opening (i.e., W1>W2>W3). The reason for not being completely vertical is that the etching processes used in forming the vertical line openings 1210 are not capable of producing perfectly vertical trenches 1206, at least not at the depths needed for the VCPA 1200. In FIG. 12F, the non-vertical opening 1210 result in horizontal line 104 having a sloped profile for features 610, 612, and 614. However, advances in processing technology may make possible the formation of deep high aspect ratio trenches and/or opening having vertical or substantially vertical sidewall surfaces. Accordingly, FIG. 12F also depicts an alternative embodiment in which a horizontal line 104v includes vertical or substantially vertical features 610v, 612v, and 614v resulting from the materials for those features being formed in a vertical or substantially vertical opening (not shown). Nevertheless, in one embodiment of the invention the dimensions of the first and second masks 1208 and 1214 used in defining the vertical line openings 1210 (as well as the spacing between adjacent vertical line openings 1210) are set so that the x and y dimensions of the vertical line openings 1210 and the x and y spacings between adjacent vertical line openings 1210 are substantially equal to the minimum feature size F capability of the photolithography system. As was shown in FIGS. 2 and 6, this results in an ultra-high-density VCPA having a unit memory cell footprint of just $2F^2$.

At a stage 1110, the diffusion barrier layers 612 and edge electrode layers 614 (see FIGS. 6 and 7) along the horizontal lines 104 are formed. To form these layers, recesses 1216 are first etched in exposed areas of the insulating layers 1204, as shown in FIG. 12E, using a selective etch process that preferentially removes only portions of the conducting layer material 1202 and not the insulating layer material 1204. Then, the diffusion barrier layers 612, which may comprise, for example, cobalt-tungsten-phosphorus (CoWP), and edge electrode layers 614, which may comprise, for example, a metal, a metal alloy, a noble metal or noble metal alloy such as platinum (Pt) or ruthenium (Ru), are deposited in the recesses 1216 using selective deposition processes that promote adhesion to conducting layers 1202 but not to the insulating layers 1204. At this stage in the method 1100, a non-ohmic device (NOD), such as for example a metal-insulator-metal (MIM) structure or diode(s), can also be formed in each of the recesses 1216. (If used, the NODs serve to suppress undesirable leakage currents in un-selected or half-selected memory elements that are generated during data operations to selected memory elements). The stage 1110 results in strips of diffusion barrier and edge electrode layers 612 and 614 running along the x-z surface edges of the horizontal lines 104, as can be seen in FIG. 12F. (The strips of diffusion barrier and edge electrode layers 612 and 614 can also be seen in FIGS. 6 and 7 above.).

Figure 12G:
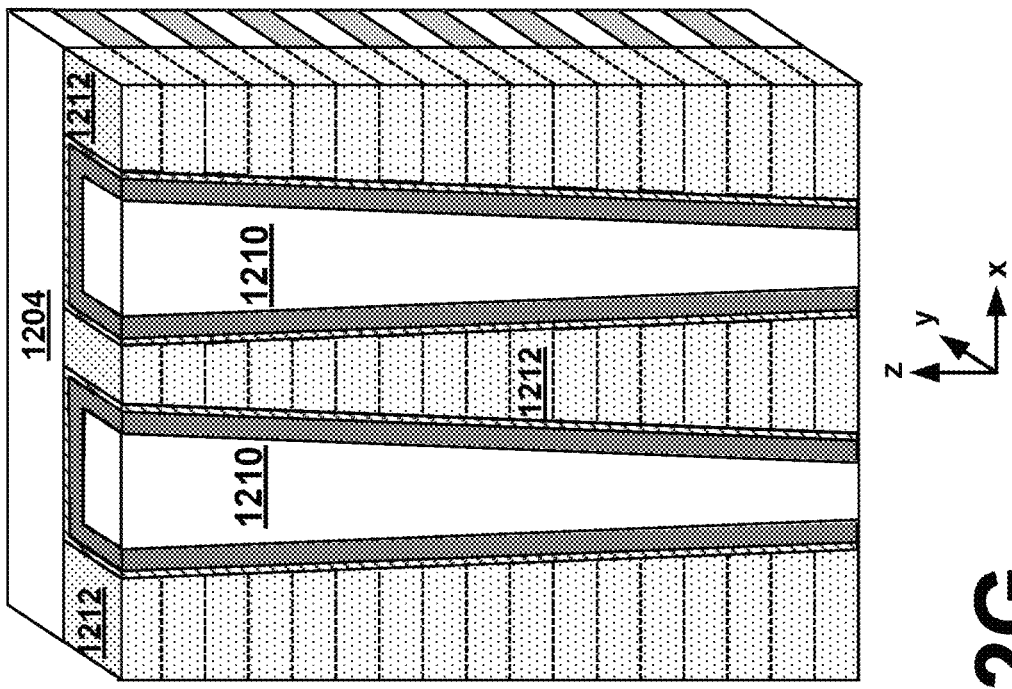
Figure 12G:
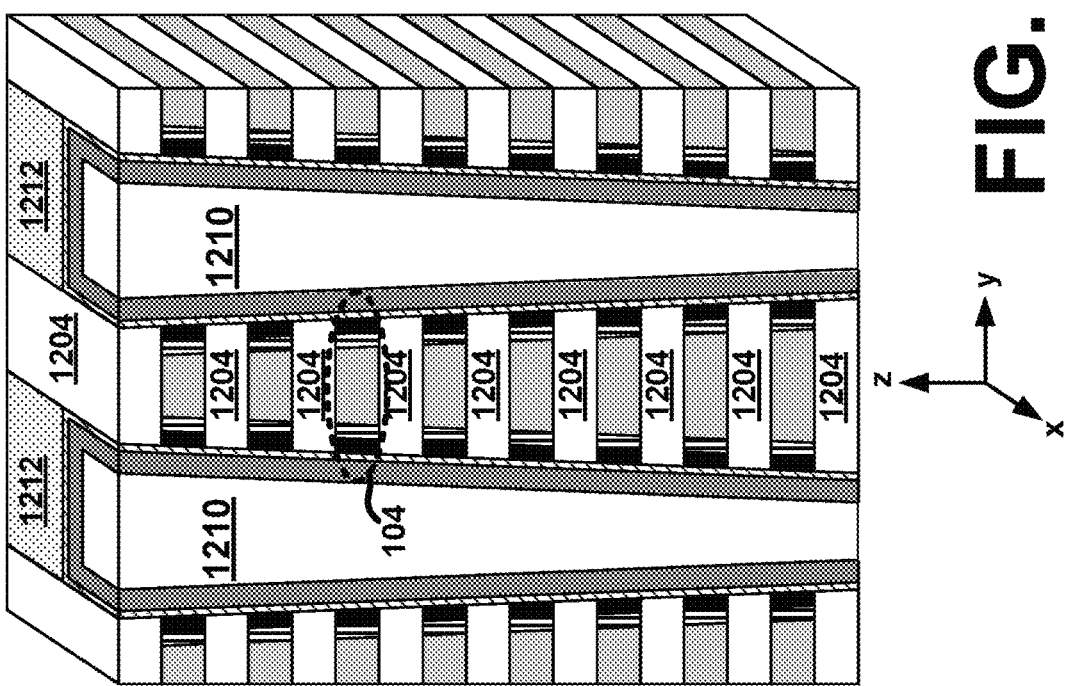

At a stage 1112 memory films, for example including but not limited to the CMO layer(s) 602 and IMO layer(s) 604 of the CMO-based memory cell 606, are formed on the inner sidewalls of the vertical line openings 1210. The deposition technique that is used is preferably a conformal deposition technique that allows formation of very thin films that can be precisely controlled. In one embodiment of the invention, atomic layer deposition (ALD) is used to deposit one or more thin-film layers of IMO and CMO having thickness ranging between about 5-50 Å and about 15-300 Å, respectively. The partially completed VCPA structure following step 1112 is shown in FIG. 12G. When multiple layers of IMO are deposited, a combined thickness of all of the IMO layer can be less than about 50 Å

Figure 12H:
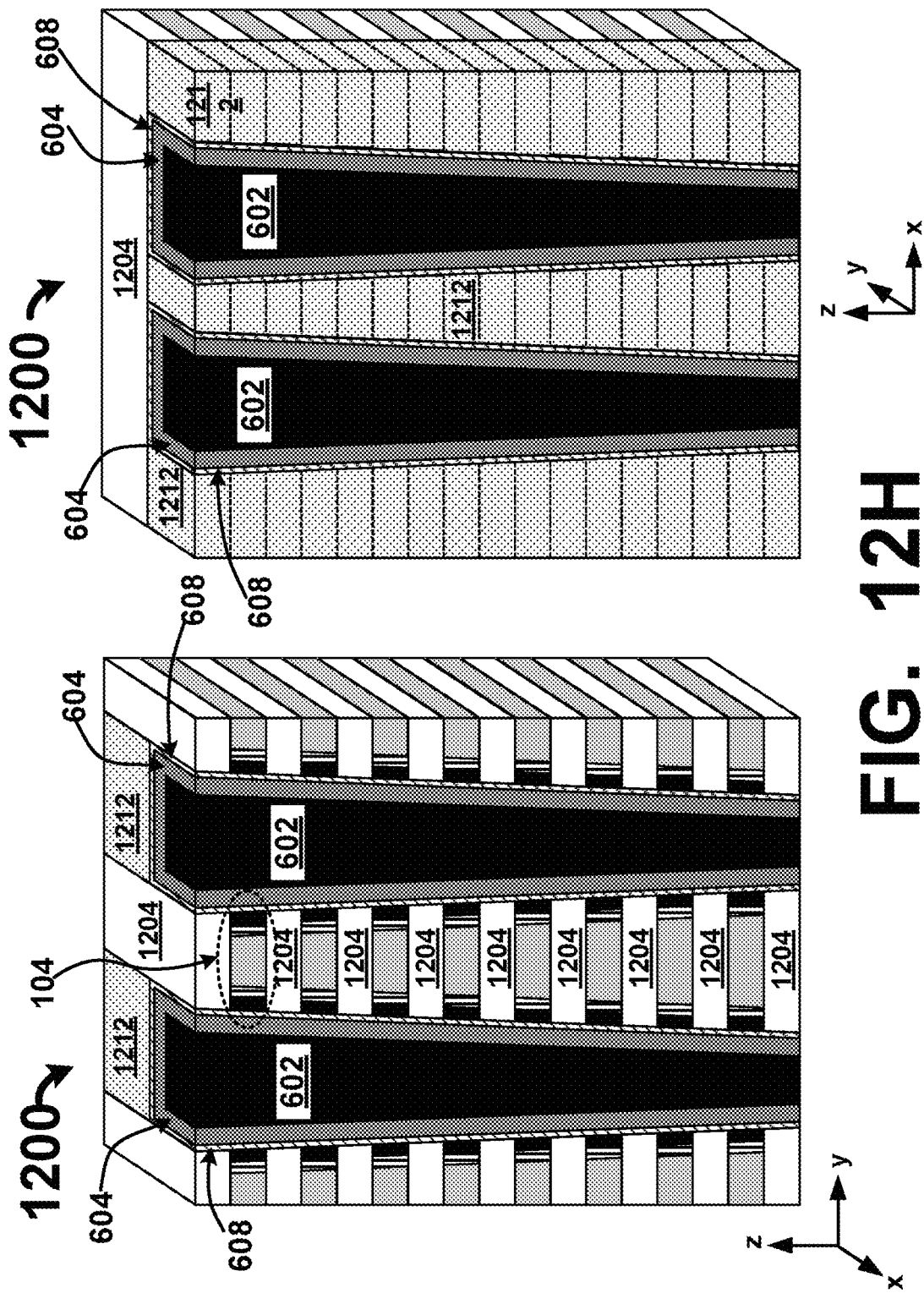

At a stage 1114, a metal (e.g., platinum (Pt) or ruthenium (Ru)) or other electrically conductive material is deposited in the memory-film-lined vertical line openings 1210. Depositing the metal results in the formation of the center conductors 602 of the vertical lines 102. The completed VCPA 1200 following completion of stage 1114 is shown in FIG. 12H.

Figure 13:
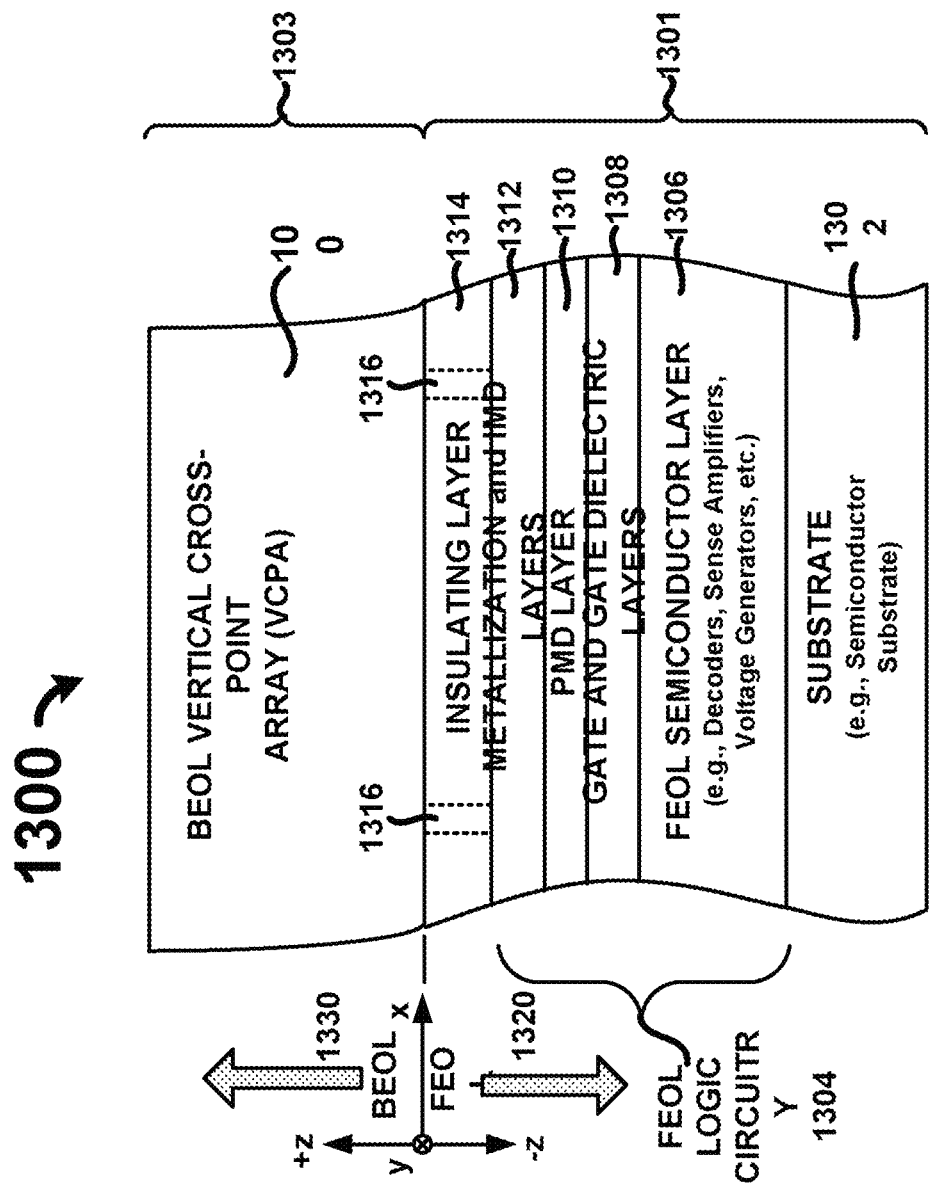
FIG. 13 is a sectional view of a completed memory structure that includes a VCPA, similar to the VCPA depicted in FIGS. 1-4, and a front-end of the line (FEOL) portion upon which the VCPA is formed.

According to one aspect of the invention, the fabrication method 1100 used to fabricate the VCPA 1200 and fabrication methods used to fabricate other VCPAs of the present invention comprises a back-end of the line (BEOL) manufacturing process, which is performed after a front-end of the line (FEOL) semiconductor manufacturing process performed to form the logic circuitry (e.g., address decoders, data buffers, registers, voltage drivers, memory controller, sense amplifiers, voltage generators, etc.) used to control the VCPAs (e.g., perform data operations on the memory cell(s) 106). FIG. 13 depicts a cross-section of a completed memory structure 1300 that includes a VCPA 100 similar to that depicted above in FIGS. 1-4 above, in accordance with this embodiment of the invention. Prior to BEOL processing (indicated by the upward-pointing large arrow 1330), FEOL processing (indicated by the downward-pointing large arrow 1320) is performed to form the various layers of FEOL portion 1301. In one embodiment of the invention, FEOL processing 1320 comprises a complementary metal-oxide-semiconductor (CMOS) semiconductor manufacturing process that includes the following salient steps: (1) implanting doped regions of active devices (e.g., transistors diodes) and other circuit elements of logic circuitry 1304 in a semiconductor substrate or a semiconductor layer 1306 formed over a substrate 1302; (2) growing gate and gate dielectric layers 1308 over the semiconductor layer 1306; (3) patterning and etching the gate and gate dielectric layers 1308 to form gates and gate dielectrics for the active devices; (4) depositing a pre-metal dielectric (PMD) layer 1310 over the gate and gate dielectric layers 1308; (5) depositing, patterning and etching metallization and intra-metal dielectric (IMD) layers 1312 over the PMD layer 1310; (6) forming vias to electrically connect active devices and other circuit elements in the underlying layers; and (7) finally, forming a top insulating layer 1314 over the metallization and IMD layers 1312. Further details of CMOS fabrication processes that may be used or readily adapted to form the FEOL portion 1301 of the memory structure 1300 may be found in R. Jacob Baker, "*CMOS Circuit Design, Layout and Simulation*," Revised Second Edition, IEEE Press, John Wiley & Sons, 2008, which is hereby incorporated by reference.

After the FEOL portion 1301 has been fabricated, the VCPA 100 is grown directly on top of the FEOL portion 1301 during BEOL processing 1330. BEOL processing 1330 is identical or similar to the VCPA fabrication method 1100 described above in connection with FIG. 11. By growing the VCPA 100 directly on top of the FEOL portion 1301, a unitary integrated circuit comprising monolithically integrated and inseparable FEOL and BEOL portions 1301 and 1303 is formed. One major benefit of forming the VCPA 100 in a separate BEOL process is that it affords the ability to form all, substantially all, or a significant portion of the logic circuitry 1304 beneath the VCPA 100 in the FEOL portion 1301. This reduces the overall footprint of the memory structure 1300 (e.g., reduces die size), thereby allowing a large number of memory structures 1300 to be manufactured across the surface of the substrate 1302 (e.g., allows for more die per wafer).

During BEOL processing (or, alternatively, beforehand during FEOL processing), conductive vias 1316 are patterned and etched beneath and/or along the periphery of the VCPA 100 and then filled with a conductive material (e.g., metal) to electrically couple the horizontal lines 104 and center conductors 202 of the vertical lines 102 of the VCPA 100 to metal interconnects in the FEOL metallization and IMD layers 1312. Additional conductive vias, previously formed through the PMD and gate and gate dielectric layers 1310 and 1308 during FEOL processing 1320 (not shown in FIG. 13; see step (6) in the summary of the salient FEOL processing steps describe above), serve to complete the electrical interconnection of the VCPA 100 to transistors and other devices in the logic circuitry 1304 of the FEOL portion 1301.

Figure 14A:
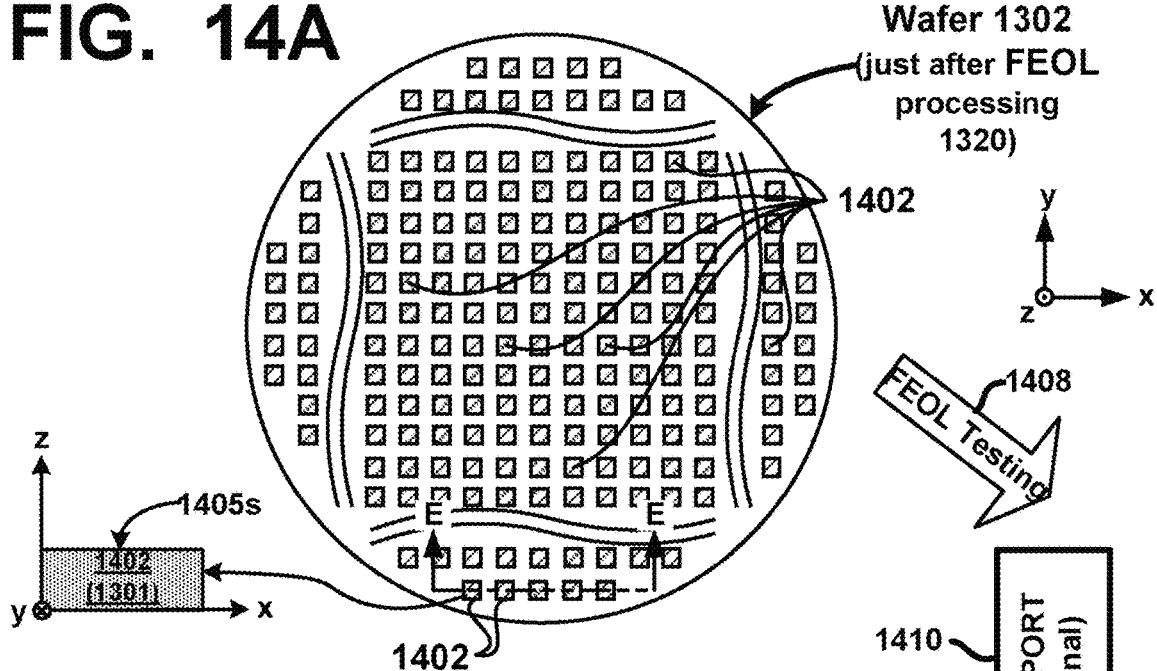
FIG. 14A depicts a wafer immediately following the performing of an FEOL semiconductor manufacturing.

According to one embodiment of the invention illustrated in FIGS. 14A and B, a plurality of memory die 1404 is formed simultaneously across the surface of the substrate (i.e., wafer) 1302. Each memory die 1404 includes one or more memory structures like or similar to the memory structure 1300 in FIG. 13. FIG. 14A shows the wafer 1302 just after FEOL processing 1320. At this stage in the process, the wafer 1302 includes a plurality of partially completed memory die 1402, each containing only the FEOL portion 1301. The FEOL-processed wafer 1302 is optionally subjected to FEOL testing 1408 to verify functionality of the logic circuitry 1304 in the partially completed memory die 1402. Partially completed memory die 1402 that fail FEOL testing 1408 are identified, e.g., by visual marking and/or electronically in a file, database, email, etc., and communicated to the BEOL fabricator and/or fabrication facility. Partially completed memory die 1402 determined to comply with a specific performance grade (e.g., frequency of operation) may also be identified and communicated to the BEOL fabricator and/or fabrication facility.

Following FEOL testing 1408, the wafer lot containing wafer 1302 is optionally transported 1410 to the BEOL fabricator and/or fabrication facility for subsequent BEOL processing. In some applications both FEOL and BEOL processing 1320 and 1330 are performed by the same fabricator or are performed at the same fabrication facility, in which case transport 1410 may not be necessary. During BEOL processing 1330, the VCPAs 100 are fabricated directly on top of the upper surface 1405s of the previously fabricated and partially completed memory die 1402. It should be emphasized that the VCPAs 100 are not glued, soldered, wafer bonded, or manually attached to the partially completed memory die 1402. Rather, they are grown directly on the upper surfaces 1405s of the partially completed memory die 1402, according to a BEOL fabrication process like or similar to the BEOL fabrication process 1100 shown and described in reference to FIG. 11 and FIGS. 12A-H above.

Figure 14B:
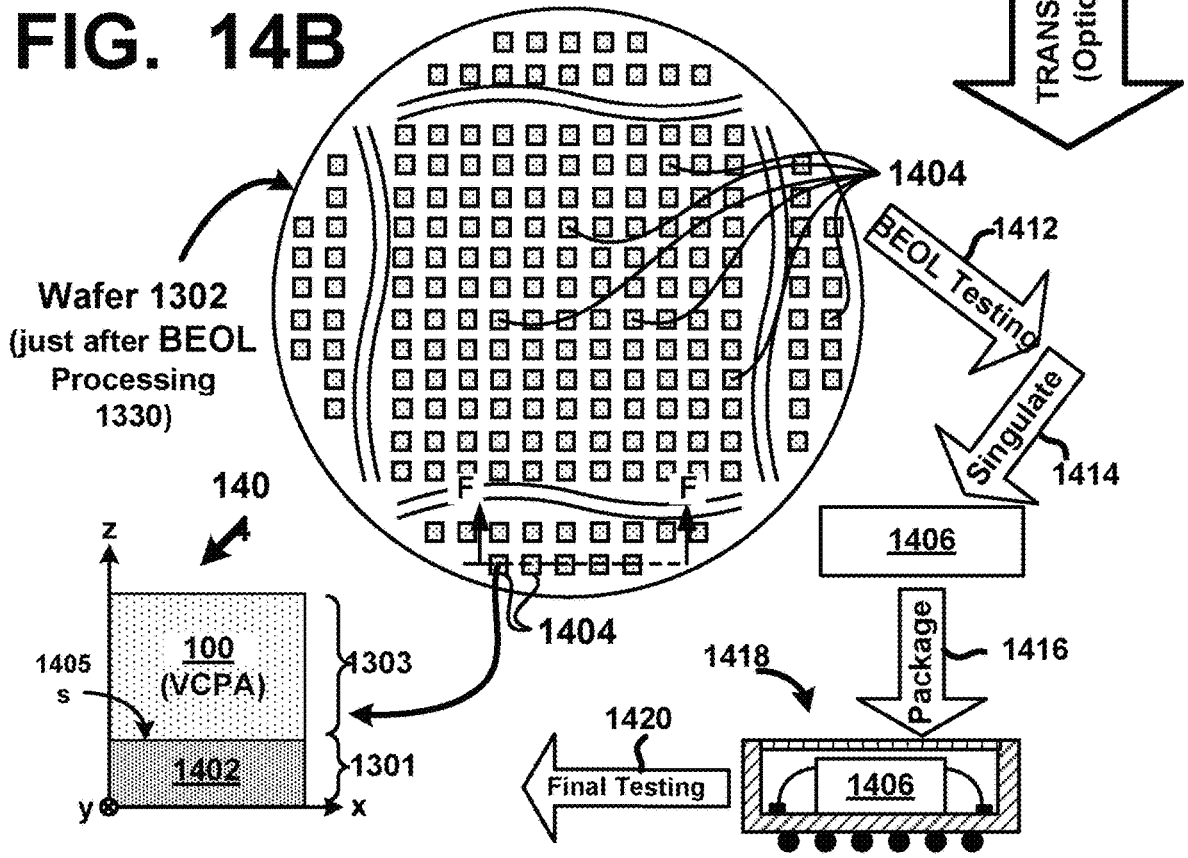
FIG. 14B depicts the same wafer as in FIG. 14A immediately following the performing of a back-end of the line (BEOL) vertical manufacturing process on die from the FEOL manufacturing process of FIG. 14A.

FIG. 14B shows the wafer 1302 just after BEOL processing 1330. The wafer 1302 includes a plurality of completed memory die 1404 formed across the wafer 1302. The wafer 1302 and completed memory die 1404 are then subjected to BEOL testing 1412 to verify functionality, measure electrical characteristics, determine yield, etc. After BEOL testing 1412 the memory die 1404 are singulated 1414 (i.e., cut or sawed) into individual memory chips 1406. Each singulated memory chip 1406 that passed both FEOL and BEOL testing 1408 and 1412 is then optionally packaged 1416 in an integrated circuit (IC) package, thereby producing a packaged memory chip product 1418. Finally, the packaged memory chip products 1418 are subjected to final testing 1420 to verify functionality.

The VCPA 100 and other VCPAs described herein are designed to have gigabit, terabit and even higher memory capacities. To simplify wire routing and reduce the number of conductive vias 1316 needed to electrically couple the VCPA 100 to the underlying logic circuitry 1304 in the FEOL portion 1301, in one embodiment of the invention the vertical lines 102, specifically, the center conductors 202 of the vertical lines 102, are arranged so that they share a reduced number of conductive "bit lines." Each vertical line 102 is then selected through one of the bit lines using address decoders and bit line select transistors configured in the FEOL logic circuitry 1304 and positioned below the VCPA and within an area footprint of the VCPA.

Figure 15:
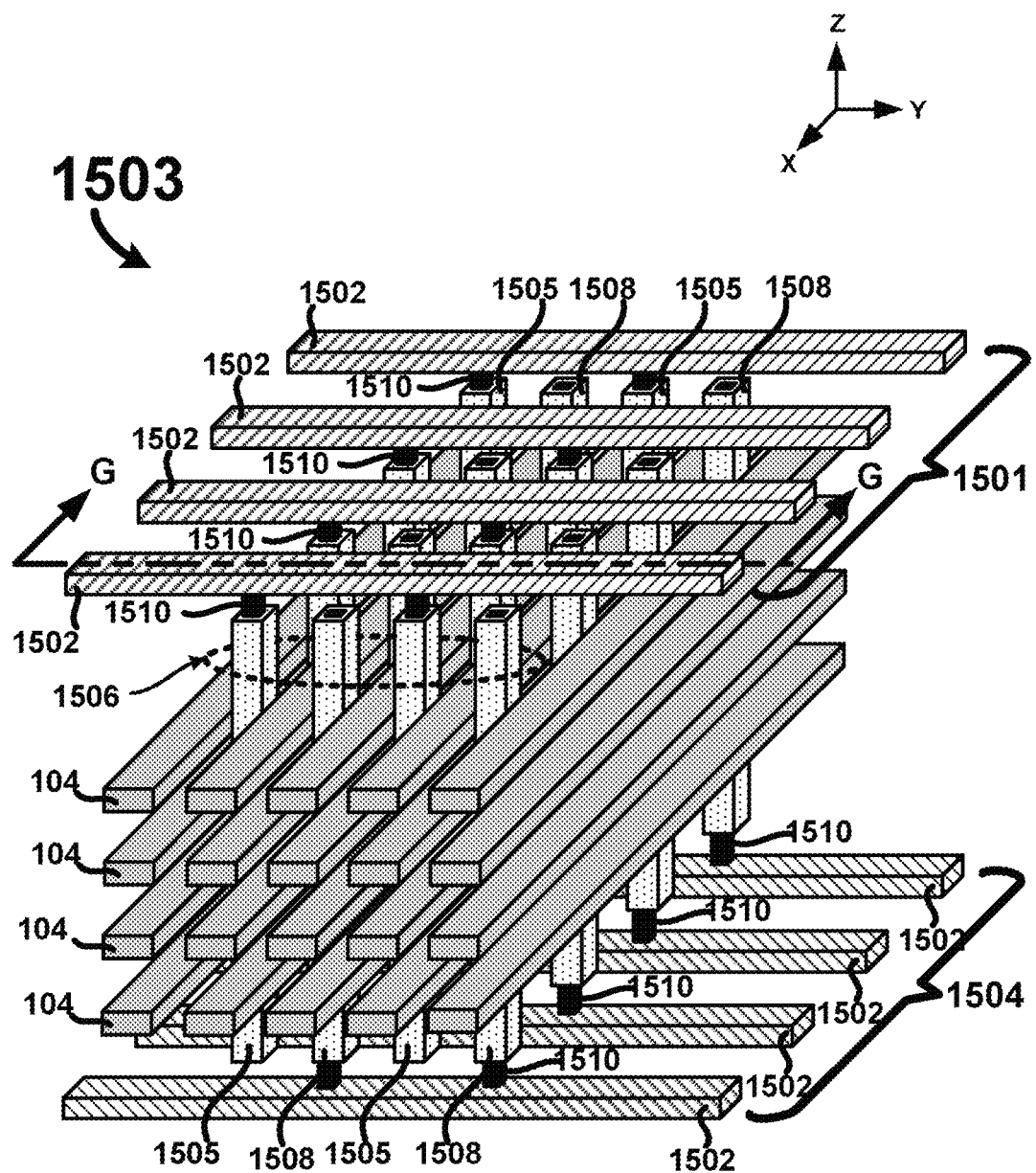
FIG. 15 depicts a BEOL portion of a memory structure containing a VCPA similar to the VCPA in FIGS. 1-3, highlighting how vertical lines of the VCPA are coupled to horizontal bit lines, according to one embodiment of the present invention.
Figure 16A:
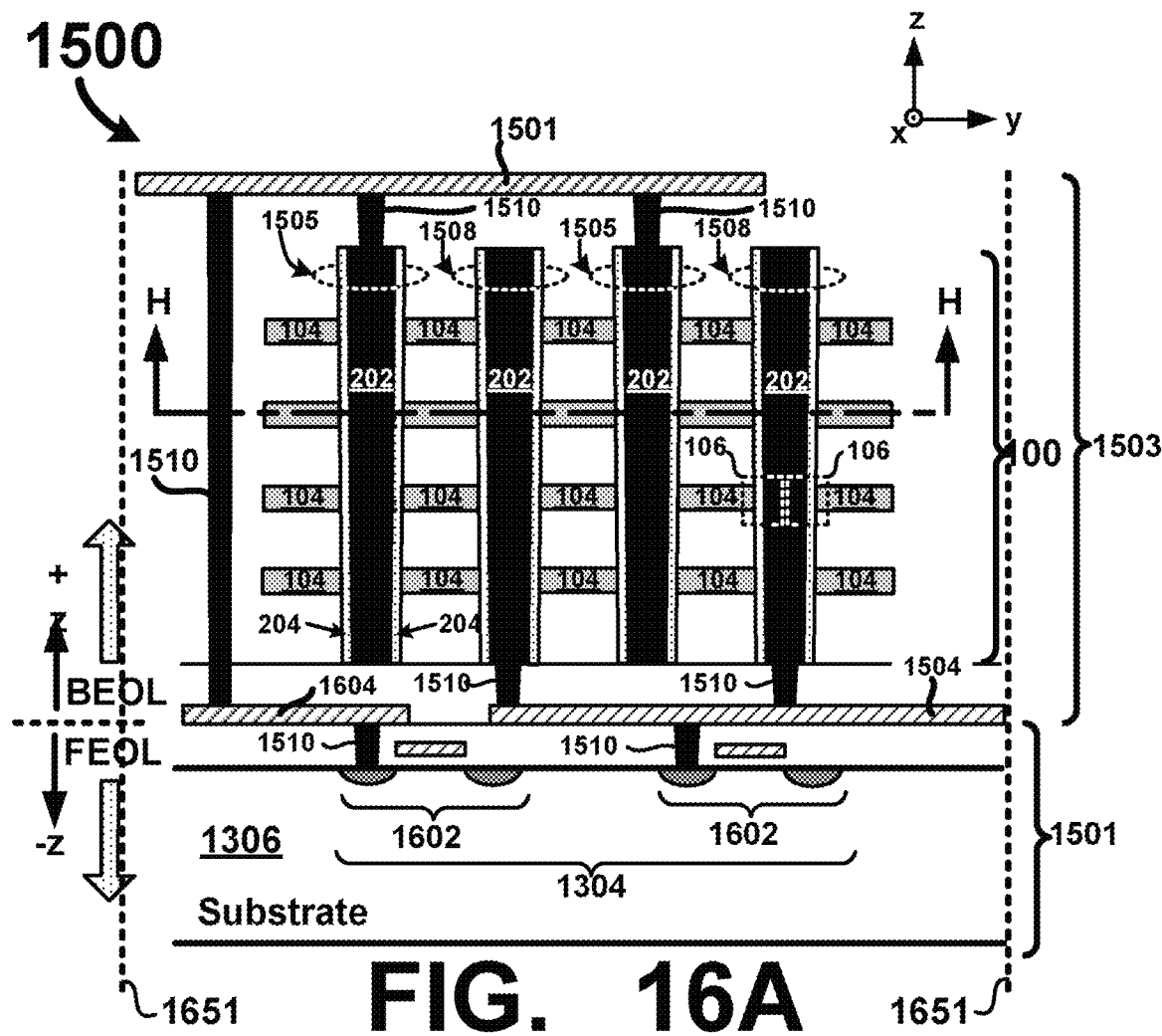
FIG. 16A is a sectional view of a memory structure containing the BEOL portion in FIG. 15 (through cutting plane G-G of the BEOL portion) and an FEOL portion containing FEOL select transistors and other logic circuitry used to electrically access the VCPA of the BEOL portion for data operations.
Figure 17:
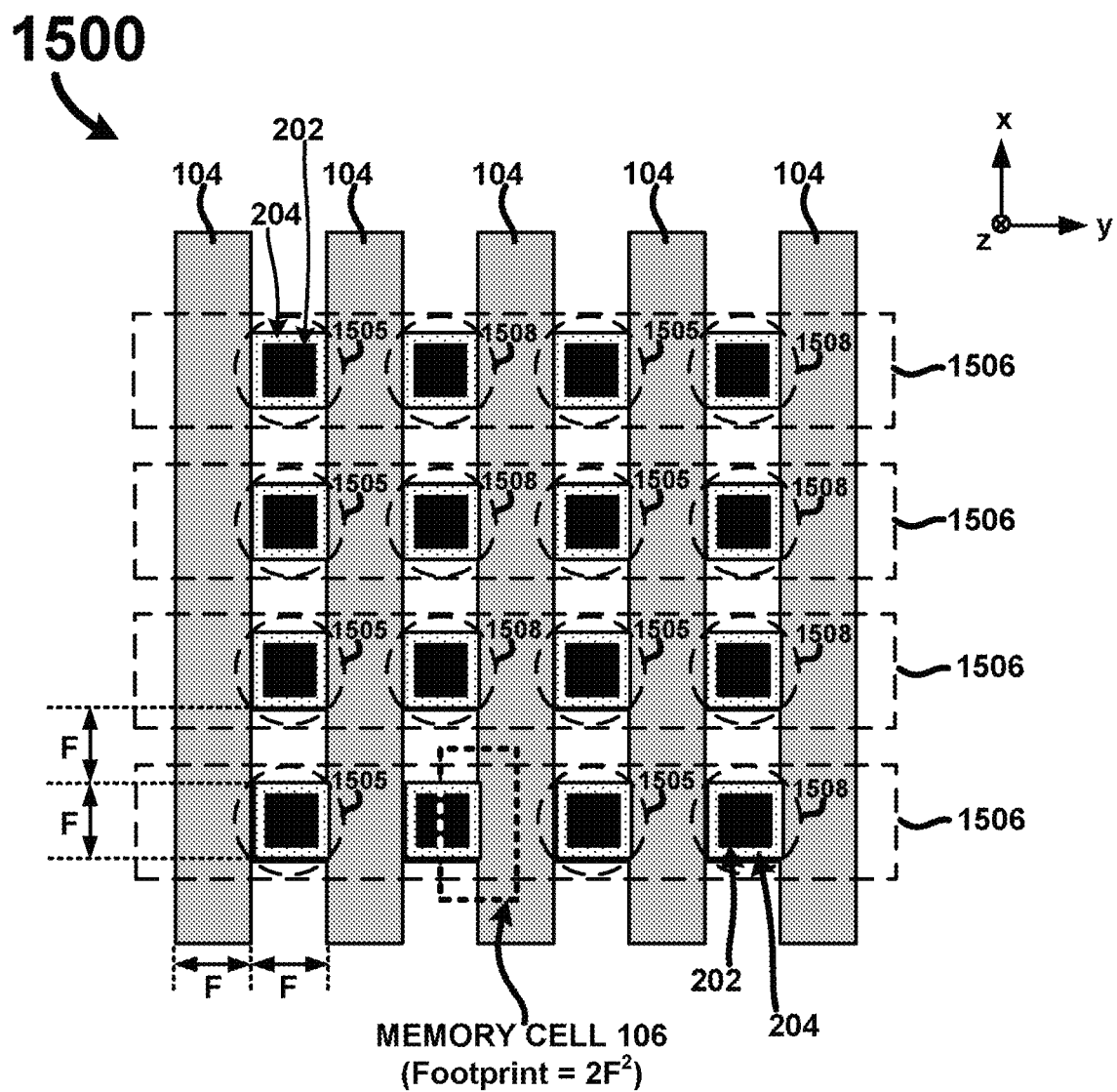
FIG. 17 is a sectional view of the BEOL memory structure in FIG. 16A through cutting plane H-H.
Figure 18:
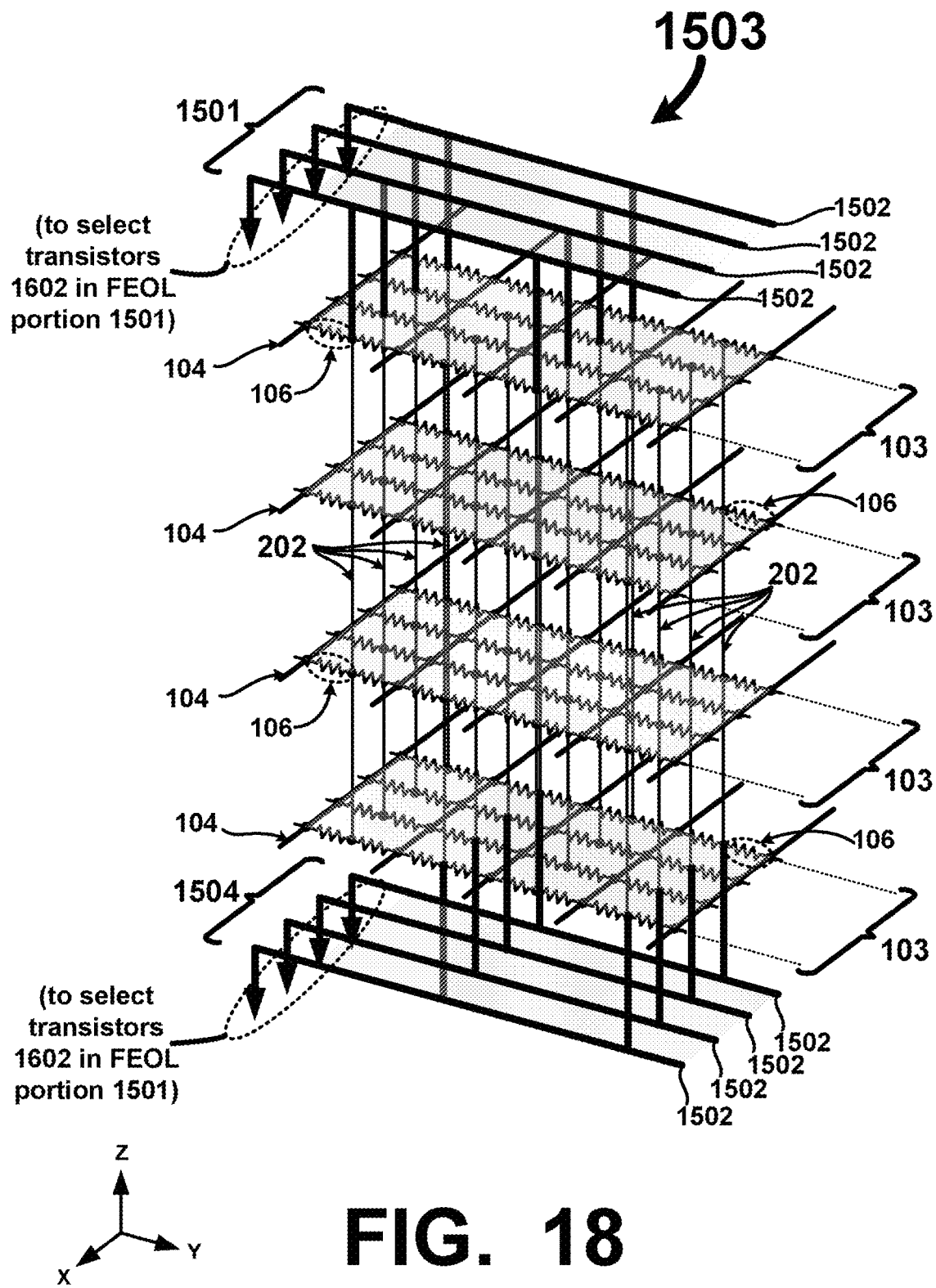
FIG. 18 is a schematic, perspective view of the BEOL portion of the memory structure in FIG. 16A.

FIG. 15 is perspective drawing of the BEOL portion 1503 of a memory structure 1500 and FIG. 16A is a sectional view of the memory structure 1500 itself (through cutting plane G-G in FIG. 15), depicting how vertical lines 1505 and 1508 of the VCPA 100 are coupled to the conductive bit lines 1502, according to one embodiment of the invention. As shown, the center conductors 202 of the vertical lines 1505 and 1508 are coupled to bit lines 1502 in either an upper bit line layer 1501 or lower bit line layer 1504, by way of conductive vias 1510. More specifically and further illustrated in FIG. 17, which is sectional view of the memory structure 1500 through cutting plane H-H in FIG. 16A, and FIG. 18, which is a schematic, perspective view of the BEOL portion 1503 of the memory structure 1500, the center conductors 202 of the odd vertical lines 1505 in each left-to-right rank 1506 of vertical lines (i.e., each column 1506 of vertical lines) are connected to a bit line 1502 in the upper bit line layer 1501 and the even vertical lines 1508 in the same column 1506 of vertical lines are connected to a bit line 1502 in the lower bit line layer 1504. The vertical line connections to the bit lines 1502 in the upper and lower bit line layers 1501 and 1502 could be reversed, i.e., so that the odd vertical lines 1505 in each column 1506 are connected to the bit lines 1502 in the lower bit line layer 1504 and the even vertical lines 1508 to the bit lines 1502 in the upper bit line layer 1501. In general, any non-adjacent vertical lines in a given column 1506 of vertical lines may be connected to a common bit line in either one of the upper or lower bit line layers 1501 and 1504 with other non-adjacent vertical lines in the given column connected to a common bit line 1502 in the other bit line layer. In other words, an even/odd alternation is not required. All that is necessary is that no two adjacent vertical lines in a given column 1506 of vertical lines share the same bit line.

In order to effectively implement a VCPA having $2F^2$ feature sizes, meeting the $2F^2$ goal requires the horizontal lines 104 connect with two memory cells, one on each side where the same horizontal line 104 touches left and right adjacent vertical lines. This means that odd (e.g., 1505) and even (e.g., 1508) vertical lines cannot be electrically shorted to each other, but instead must be electrically isolated from each other by separate select devices (e.g., a FET). Otherwise, shorting adjacent vertical lines (e.g., 1505, 1058) into a common bit line in a $2F^2$ configuration would mean that an activated horizontal line between the shorted vertical lines would electrically couple both memory cells to the same electrical bit, thereby defeating the purpose of electrically isolating the left and right memory cells from each other.

In order to have multiple vertical lines share a single select device, the even and odd vertical lines must still be electrically isolated from each other for the $2F^2$ configuration to work. This can be accomplished if one of the connecting wires is positioned above the VCPA (e.g., the even bit line wires) and the other connecting wire is positioned below the VCPA (e.g., the odd bit line wires).

Another conventional approach that results in a $4F^2$ configuration is accomplished by having each vertical line go directly down to a unique select FET positioned in the substrate layer. However, due to a pitch of the FET's being greater than the pitch between vertical lines, every other vertical line is skipped resulting in electrically insolating the horizontal lines which connect to left and right memory cells and a resulting $4F^2$ footprint. Preferably, the denser $2F^2$ approach is desirable for the VCPA of the present application.

In various embodiments of the invention, the bit lines 1502 are formed in one or more x-y planes, like the horizontal lines 104, but extend perpendicular to (i.e., in the y-direction) relative the horizontal lines 104. (Note that in embodiments of the invention in which bit lines 1502 are used, the center conductors 202 of the vertical lines may also be referred to as "local bit lines" (or "LBLs") and the bit lines 1502 may also be referred to as "global bit lines" (or "GBLs"). However, for sake of consistency throughout this disclosure the vertical lines will continue to be referred to as vertical lines, and the bit lines will continue to be referred to as bit lines.

As shown in FIG. 16A, bit lines 1502 of both the upper and lower bit line layers 1501 and 1504 are electrically coupled to FEOL bit line select transistors 1602 (i.e., metal oxide field effect transistors (MOSFETs)) fabricated in the underlying FEOL portion 1501 of the memory structure 1500, by way of conductive vias 1510 and metal interconnects 1604. The select transistors 1602 operate to electrically couple or decouple the center conductors 202 of the vertical lines 1505 and 1508 of associated memory cells 106 to decoding or sense circuits in the FEOL logic circuitry 1304, depending on which memory cells 106 in the VCPA 100 are selected during data operations. Here, dashed lines 1651 demarcate a footprint boundary of the BEOL VCPA in relation to the FEOL substrate layer 1306. As will be described in greater detail below in regards to FIG. 16B, the select transistors 1602 are positioned beneath the VCPA within the boundaries of the footprint 1651. The bit lines 1502 of the upper bit line layer 1501 are formed during BEOL processing, after the VCPA 100 has been fabricated. The bit lines 1502 of the lower bit line layer 1504 are formed in one or more of the FEOL metallization layers 1312 during FEOL processing or, subsequently, in one or more other metal layers formed above the top FEOL portion but below the VCPA 100 during BEOL processing.

Figure 16B:
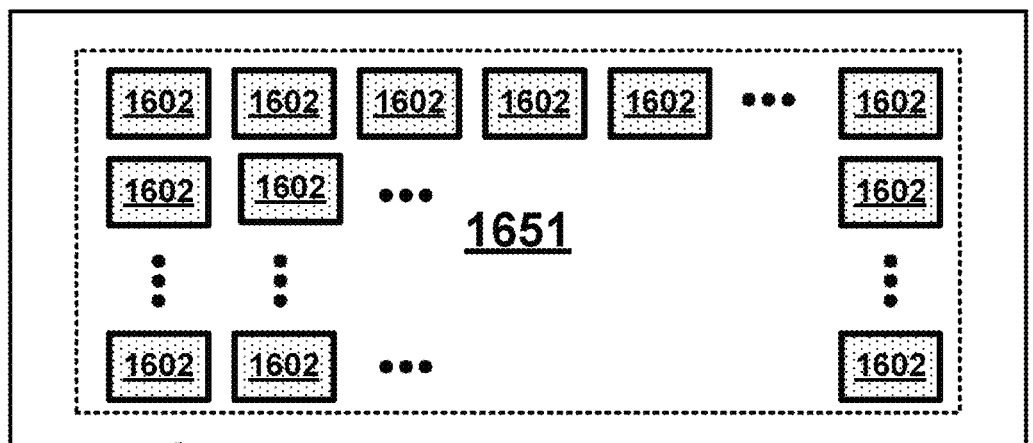
FIG. 16B is a top plan view of FEOL select transistors positioned on a substrate and positioned directly under and completely within an area foot print of a BEOL VCPA fabricated directly over the substrate, according to one embodiment of the present invention.

FIG. 16B depicts a top plan view of floor planning (e.g., layout or positioning) of the select transistors 1602 relative to a footprint 1651 of the BEOL VCPA. Footprint 1651 is within the die area of the substrate 1306 and the select transistors 1602 which are fabricated FEOL with logic circuitry 1304 are positioned in the FEOL layer entirely within the footprint 1651 so that all of the select transistors 1602 are positioned beneath the VCPA 100 and are electrically coupled (e.g., 1510, 1504, 1501) with their respective vertical lines 1505 and 1508. Placing the select transistors 1602 within the footprint 1651 reduces die size and allows for reduced feature sizes (e.g., $2F^2$).

Figure 19:
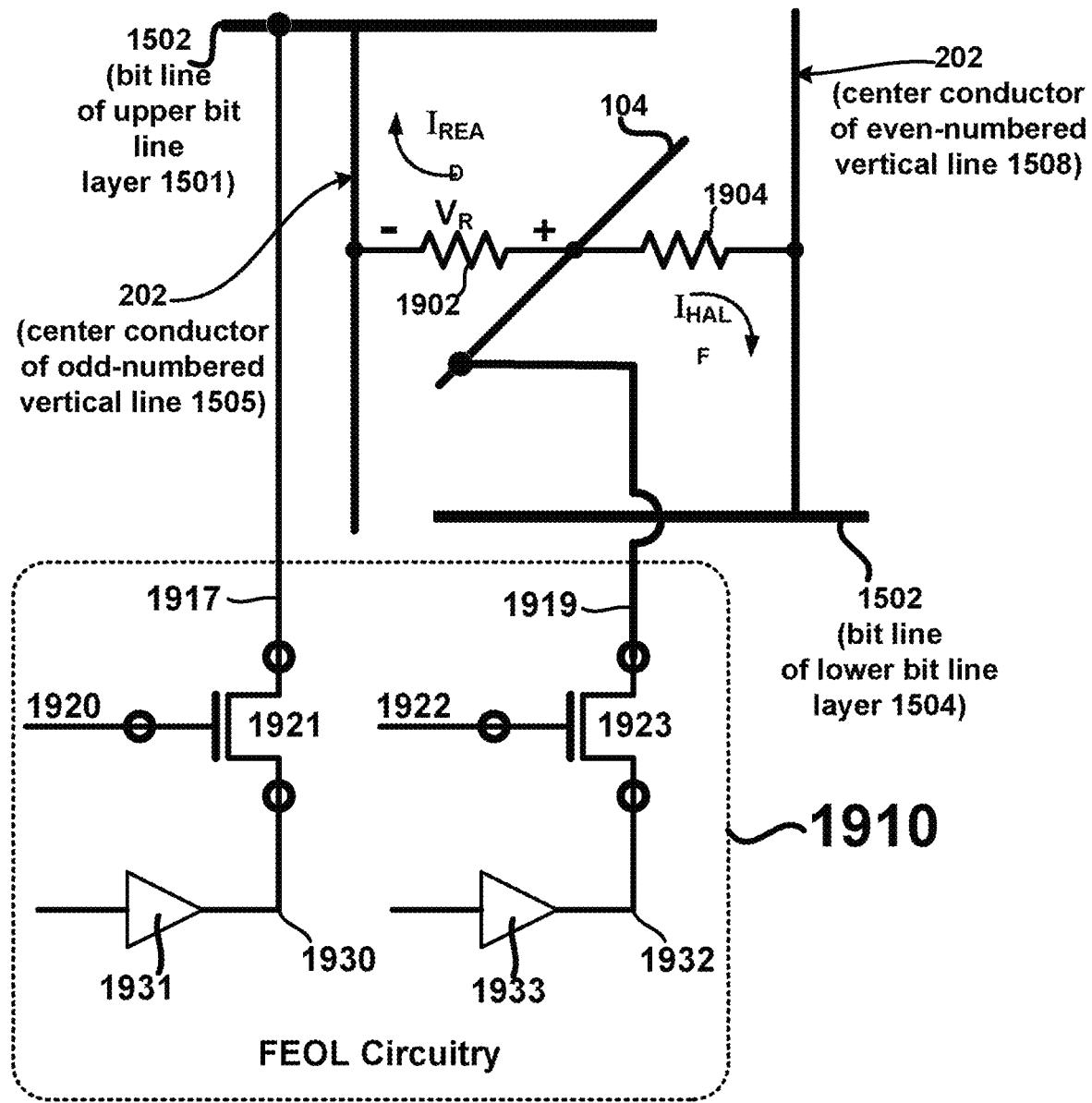
FIG. 19 is a schematic drawing depicting how use of upper and lower bit line layers in the BEOL portion of the memory structure in FIG. 16A and connections of the center electrodes of odd and even vertical lines to the upper and lower bit line layers work to divert a half-select current $I_{HALF}$ passing through a half-selected memory element away from a bit line used in reading a selected memory element.

FIG. 19 is a schematic drawing illustrating how using the upper and lower bit line layers 1501 and 1504 and alternating bit line connections aid in reading a selected memory cell 1902. A read current $I_R$ EAD passing through the selected memory cell 1902 is directed vertically in the +z direction along the center conductor 202 of its associated vertical line 102, horizontally through a bit line 1502 of one of the upper bit line layer 1501, and finally vertically in the −Z direction through a conductive via 1510 and/or horizontal interconnect (if necessary) that is/are electrically coupled to a select transistor 1602 in the underlying FEOL portion 1501. At the same time, an undesired half-select cell current $I_{HALF}$ passing through the half-selected memory cell 1904 on the opposing side of the selected horizontal line 104 is diverted through a bit line 1502 in the lower bit line layer 1504. Diverting the half-select cell current $I_{HALF}$ away from the bit line 1502 used in reading the selected memory cell 1902 allows the stored memory state of the selected memory cell 1902 to be read without being adversely influenced by the half-select cell current $I_{HALF}$, even though the selected and half-selected memory cells 1902 and 1904 share the same horizontal line 104.

FIG. 19 also depicts how FEOL circuitry 1910 may be implemented to perform data operations such as read and write on selected memory cells. Here, nodes 1920 and 1919 of FETs 1921 and 1923 can be activate to electrically couple voltage drivers 1931 and 1933 to terminals of selected memory element 1902 to apply read voltage $V_R$ across the selected memory element 1902 thereby generating the read current $I_{READ}$ in memory element 1902 and half-select current $I_{HALF}$ in half-selected memory element 1904.

In the exemplary memory structure 1500 shown and described in FIGS. 15-19 above, the select transistors 1602 used to couple or decouple the center conductors 202 of the vertical lines 102 to decoding or sense circuits in the logic circuitry 1304 are formed in the underlying FEOL portion 1501. Fabricating the select transistors 1602 in the FEOL portion 1501 among all of the other circuit elements of the logic circuitry 1304 without having to increase the footprint of the VCPA 100 can be challenging since the substrate 1306 beneath the VCPA 100 has only a limited area. This problem becomes even more challenging the higher the capacity the VCPA 100 is. Higher capacity VCPAs of the same footprint have a greater number of memory layers 103 and, consequently, longer vertical lines 102 and a greater number of memory cells 106 connected to each vertical line 102. However, the lengths of the vertical lines 102 and the number of memory cells 106 that may be connected to each vertical line 102 (i.e., the maximum memory cell 106 to vertical line 102 ratio) are limited by the amount of tolerable voltage drop along each vertical line 102 and the amount of leakage current that can be tolerated from half-selected and partially-selected memory cells associated with the vertical lines 102 during data operations. To avoid exceeding these length and memory-cell-to-vertical-line ratio limits, the vertical lines 102 can be segmented and connected to additional select transistors 1602 when the limits are reached. Alternatively, memory capacity can be increased by stacking multiple VCPAs 100 one over the other in the vertical (i.e., +Z direction), such that each VCPA 100 has vertical lines 102 that do not exceed either of these limits. Unfortunately, both approaches to increasing memory capacity require a greater number of select transistors 1602. While the number of excess select transistors may not be a problem in all circumstances, in circumstances where the available area needed to accommodate the additional select transistors is severely constrained, the size of the select transistors 1602 must be shrunk, which requires a more aggressive and expensive semiconductor manufacturing process, or the footprint of the memory structure must be increased. In some cases, neither of these alternatives is particularly desirable.

Figure 20:
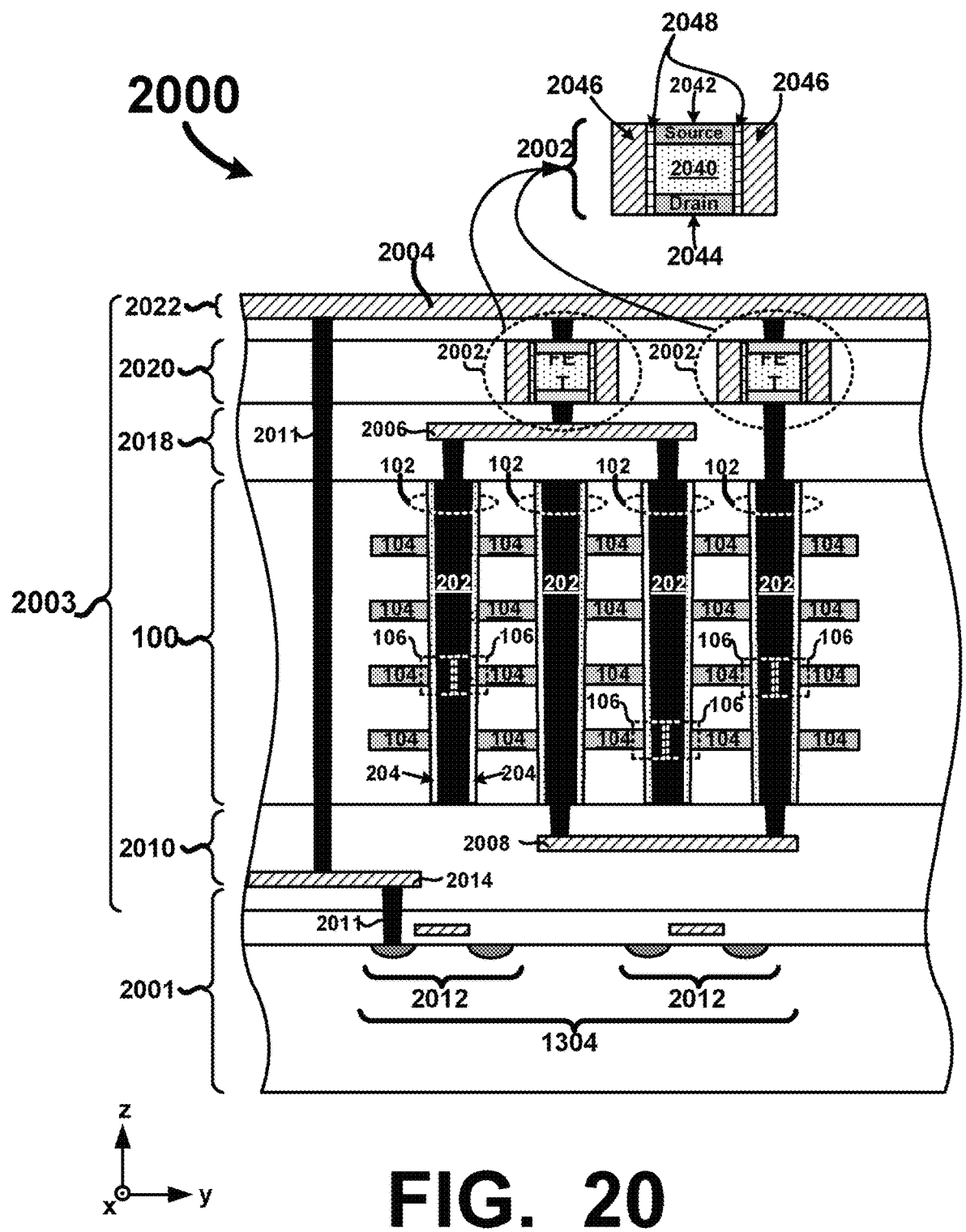
FIG. 20 is a sectional drawing of a memory structure that utilizes BEOL vertical field-effect transistors (FETs) formed in BEOL transistor layers above a VCPA to selectively couple the center conductors of vertical lines in the VCPA to bit lines in an overlying bit line layer, according to an embodiment of the present invention.
Figure 21:
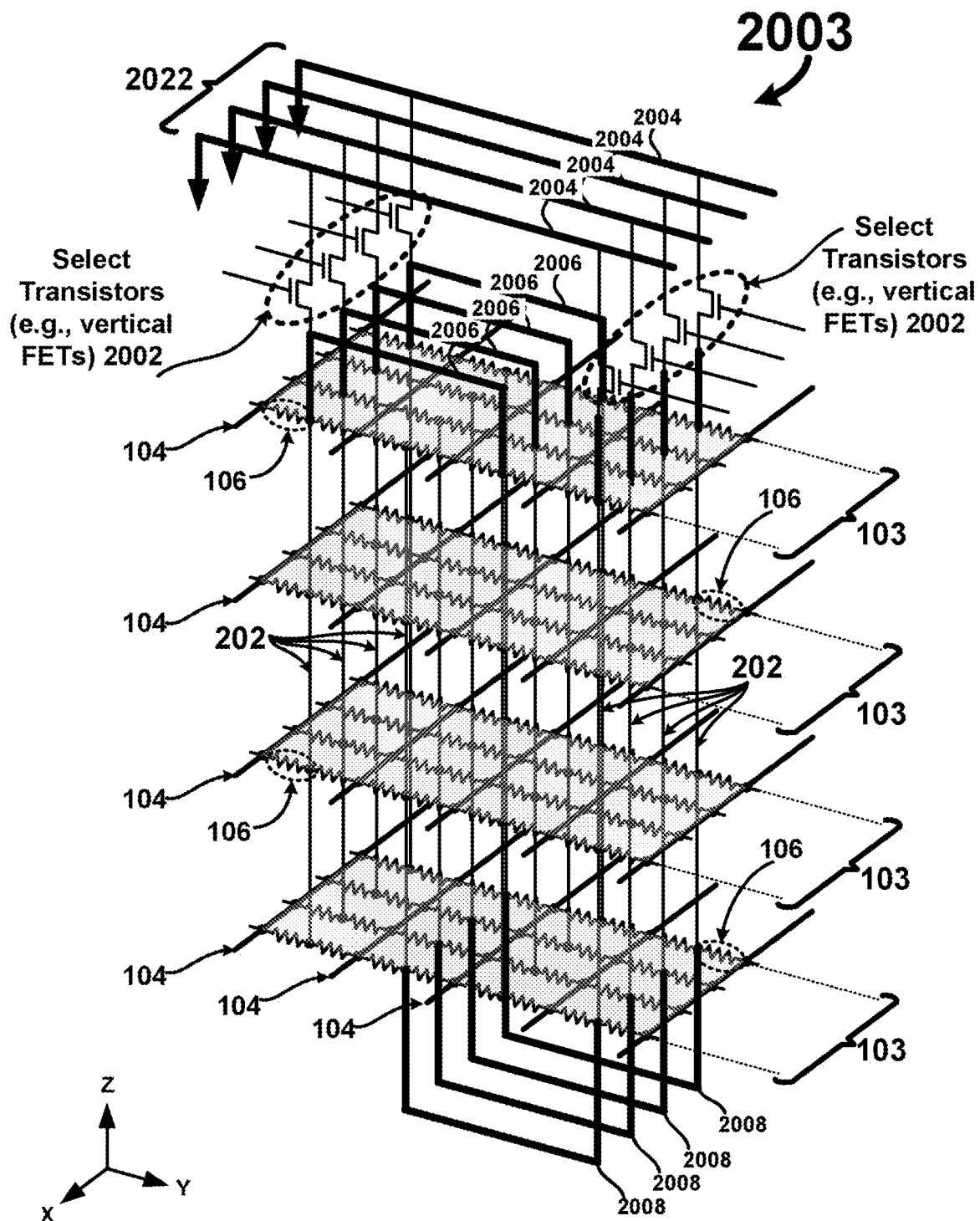
FIG. 21 is a schematic, perspective view of the BEOL portion of the memory structure in FIG. 20.

FIGS. 20 and 21 are sectional and schematic, perspective drawings of a memory structure 2000 (FIG. 20) and the BEOL portion 2003 thereof (FIG. 21), according to an embodiment of the invention that avoids the problem of accommodating a large number of select transistors 1602 in the underlying FEOL portion 2001. According to this embodiment of the invention, rather than fabricating the select transistor in the FEOL portion 2001, the select devices (e.g., transistor(s), diode(s), NODs, MIMs, etc.) are fabricated in BEOL layers 2020 above the VCPA 100. For purposes of explanation, the select devices depicted are FETs fabricated BEOL in a transistor layer above the VCPA. The actual type of select device used will be application dependent and is not limited to the select devices described herein. The center conductors 202 of two or more alternating (or non-adjacent) vertical lines 102 (e.g. two or more "odd" vertical lines) in a given left-to-right rank (i.e., column) of vertical lines are selectively electrically coupled, via interconnect 2006 in an upper interconnect layer 2018, to a bit line 2004 in a bit line layer 2022 using a select device 2002 (e.g., a vertical FET) formed in the transistor layers 2020. The center conductors 202 of two or more different alternating or non-adjacent vertical lines 102 (e.g., two or more "even" vertical lines) in the same left-to-right rank of vertical lines (i.e., the same column of vertical lines) are selectively coupled to the same bit line 2004 using a different one of the select device 2002, via interconnect 2008 in a lower interconnect layer 2010. The center conductors 202 of the vertical lines 102 in the remaining columns of vertical lines 102 are selectively coupled to other bit lines 2004 of the bit line layer 2022 in a similar manner, as can be best seen in the schematic, perspective drawing of the BEOL portion 2003 of the memory structure 2000 in FIG. 21. It should be mentioned that whereas only four vertical lines per column of vertical lines 102 is shown in FIGS. 20 and 21, an actual memory structure would have hundreds, thousands or more of vertical lines per left-to-right rank, as was explained above. Accordingly, in an actual memory structure there would typically be many more BEOL select devices 2002 in BEOL transistor layers 2020. Further, whereas each select device 2002 in FIGS. 20 and 21 is configured to selectively couple the center conductors 202 of just two non-adjacent vertical lines to a common bit line 2004, each select device 2002 could alternatively be configured to selectively couple the center conductors 202 of more than two non-adjacent vertical lines 102 to a common bit line 2004, depending on the number of memory layers 103 and/or how much leakage current from half-selected and partially-selected memory cells can be tolerated during data operations.

The select devices 2002 of the memory structure 2000 may comprise planar or vertical FETs. In the embodiment shown in FIGS. 20 and 21, each select device 2002 comprises a vertical FET, such as a gate-all-around FET (i.e., "donut" FET), FinFET, or dual- or multi-gate FET. However, any suitable type of FET may be used. As shown in the magnified view of the vertical FET 2002 in FIG. 20, each vertical FET 2002 may comprise a semiconducting channel region 2040 of a first conductivity type (e.g., n-type or p-type) bounded on top and bottom by semiconducting source and drain regions 2042 and 2044 of opposite conductivity type; a gate 2046; and a gate dielectric layer 2048 formed between the gate 2046 and channel region 2040 that extends vertically between the source and drain regions 2042 and 2044. The gates 2046 of the vertical FETs 2002 are electrically connected to FEOL decoding circuitry (part of FEOL logic circuitry 1304) in the underlying FEOL portion 2001, by way of conductive vias (not shown in FIG. 20) formed through the various layers of the BEOL and FEOL portions 2003 and 2001. The vertical FETs 2002 function as switches that turn ON and OFF in response to signals generated by the decoding circuitry. It should be mentioned that although FETs are used as the selection devices 2002 in this and other exemplary embodiments of the invention, other types of selection devices such as bipolar junction transistors, one or more thin-film diodes, metal-insulator-metal (MIM), etc. may be alternatively used. If FETs are used, they may be configured to operate as inversion devices or depletion devices.

Figure 22:
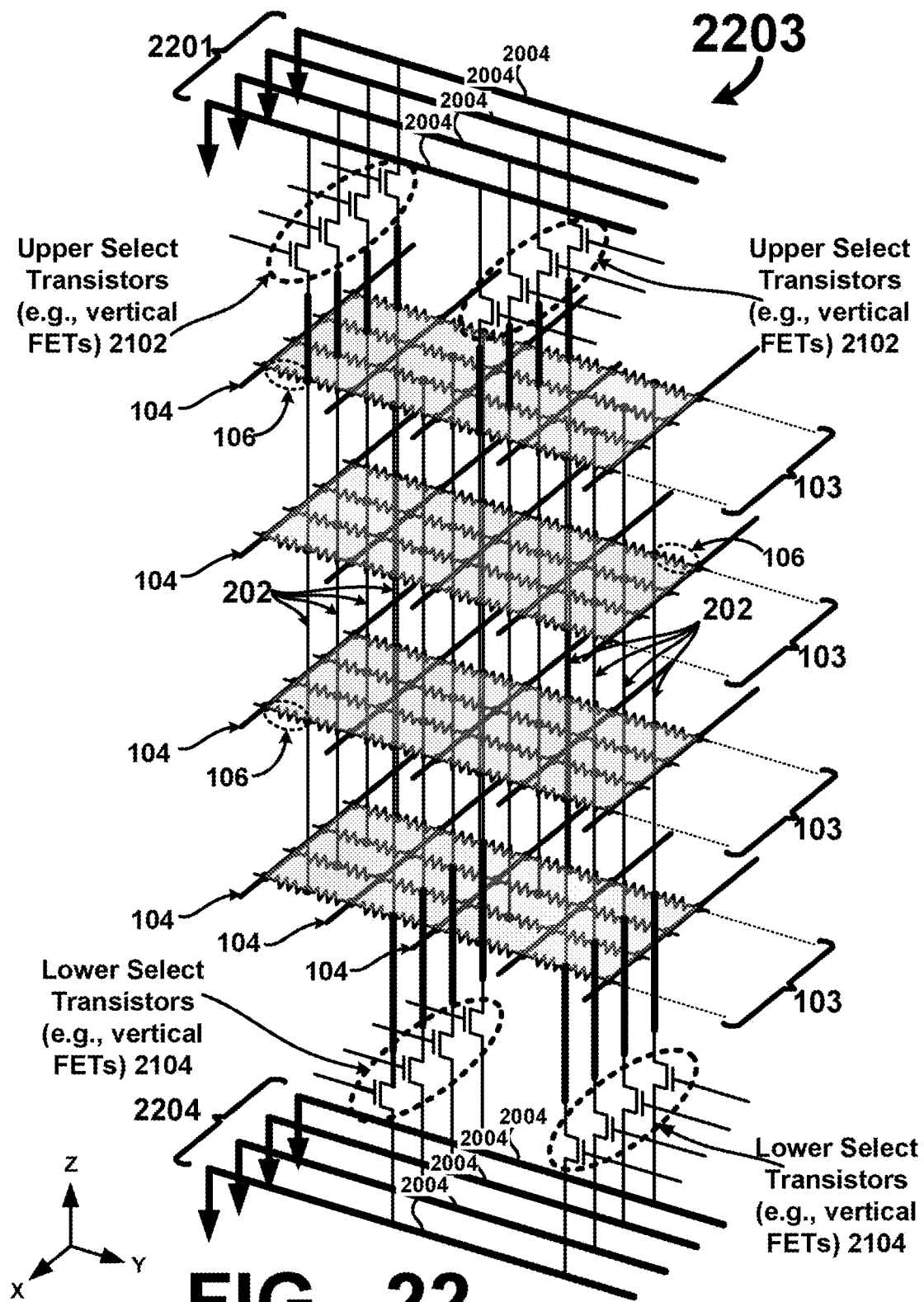
FIG. 22 is a schematic, perspective view of the BEOL portion of a memory structure similar to that depicted in FIG. 21 but including "upper" vertical select transistors that selectively couple the center conductors of "odd" vertical lines to bit lines in an upper bit line layer and "lower" vertical select transistors that selectively couple the center conductors of "even" vertical lines to bit lines in a lower bit line layer, according to one embodiment of the invention.

In the exemplary memory structure 2000 in FIG. 20, the select transistors 2002 are formed in transistor layers 2020 above the VCPA 100. In other embodiments of the invention, the select transistors 2002 are formed in transistor layers 2020 below the VCPA 100 (e.g., between the upper layer of the FEOL portion 2001 and the bottom of the VCPA 100) or in transistor layers formed both above and below the VCPA 100. FIG. 22 depicts, for example, the BEOL portion 2203 of a memory structure having select transistors 2002 formed both above and below the uppermost and lowermost memory layers 103 of the VCPA. In this embodiment of the invention, "upper" select transistors 2102 operate to selectively couple the center conductors 202 of two or more alternating or non-adjacent vertical lines 102 (e.g., "odd" vertical lines) to bit lines 2004 in an upper bit line layer 2201. The "lower" select transistors 2104 operate to selectively couple the center conductors 202 of two or more different alternating or non-adjacent vertical lines 102 (e.g., "even" vertical lines) to bit lines 2004 in a lower bit line layer 2204.

Figure 23:
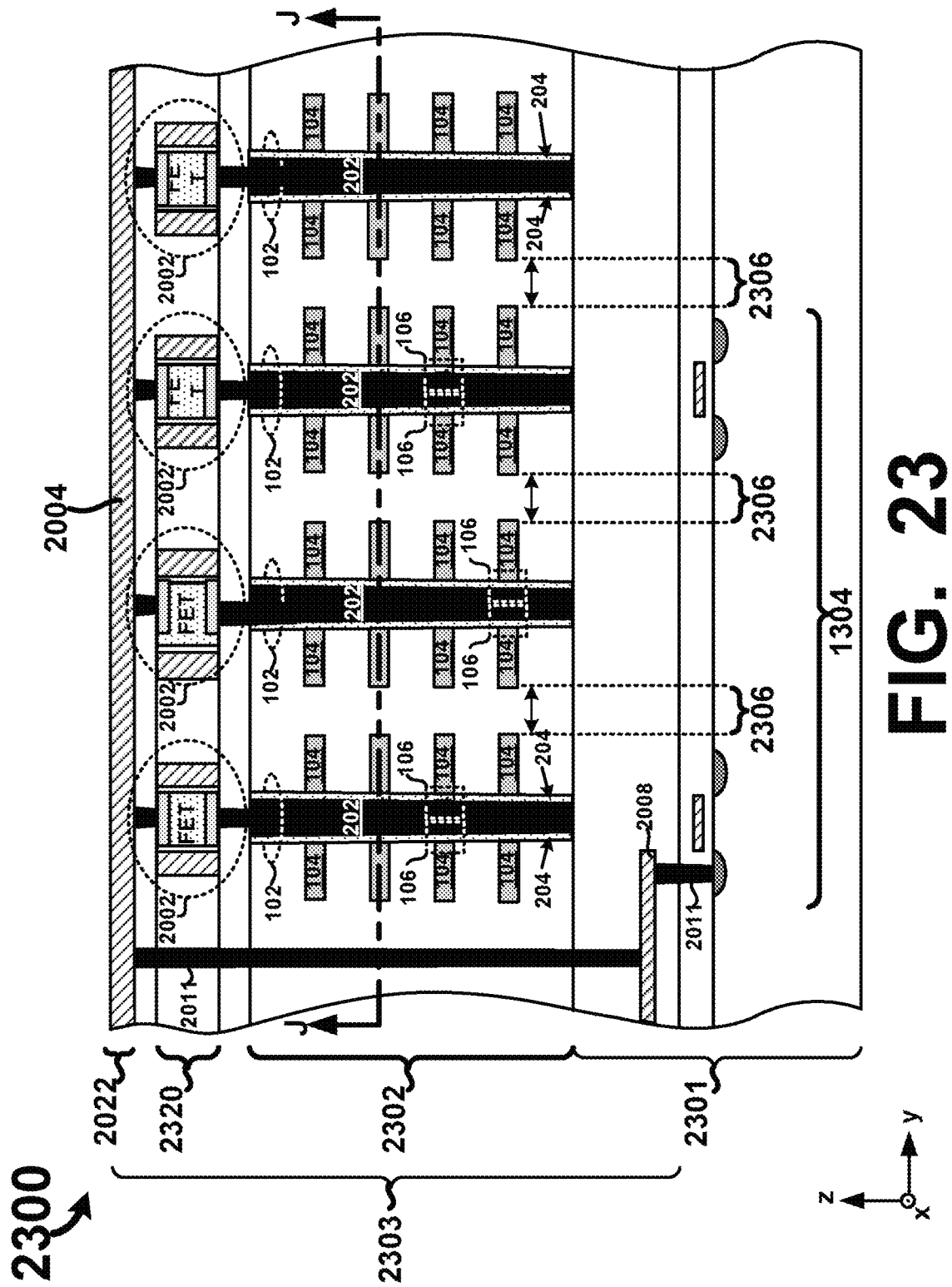
FIG. 23 is a sectional view of a memory structure according to another embodiment of the invention that includes vertical BEOL FETs, similar to as the memory structure in FIGS. 16A-22, and an alternative VCPA structure having a memory cell footprint of $4F^2$.
Figure 24:
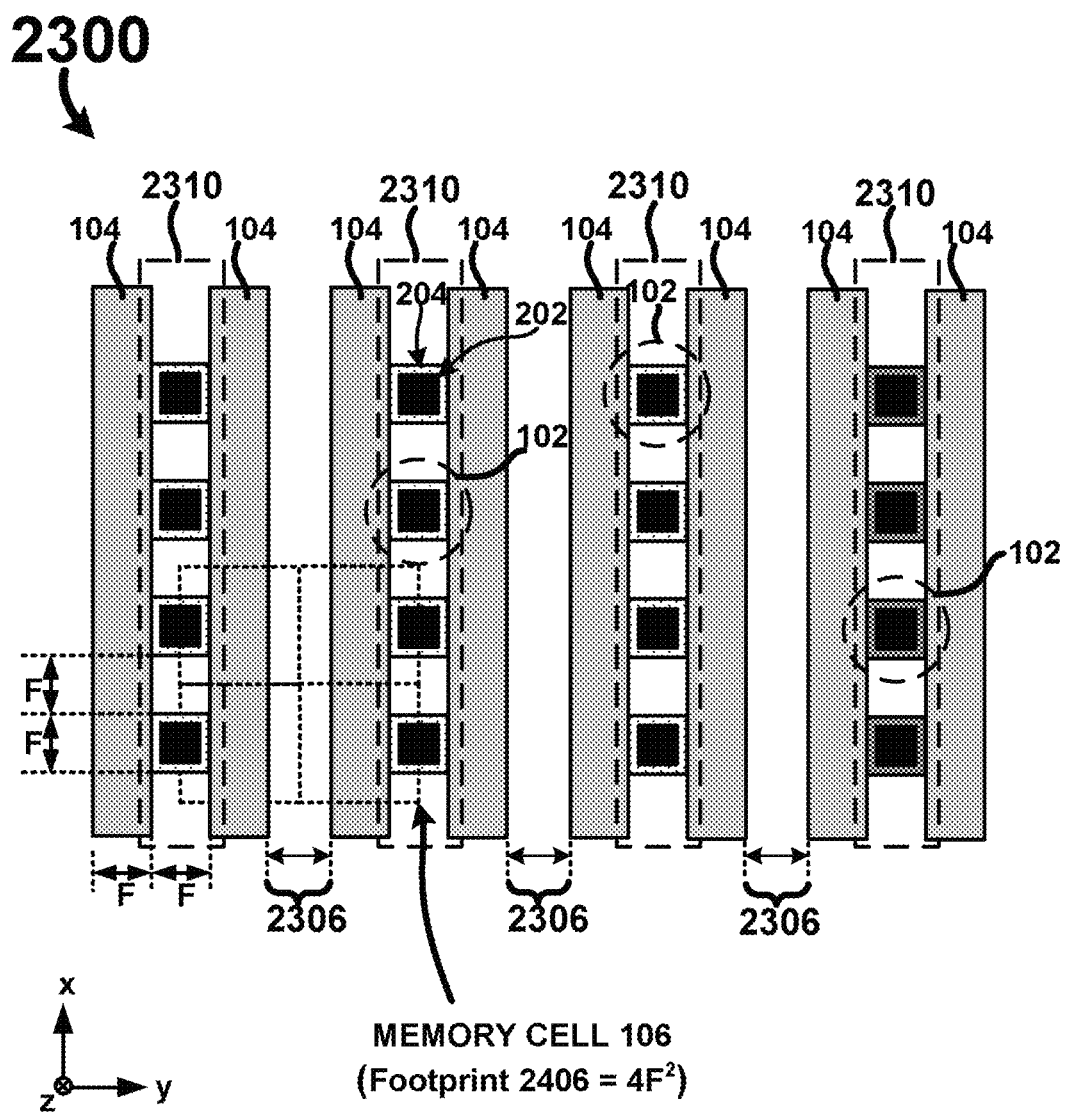
FIG. 24 is sectional view of the memory structure in FIG. 23 through cutting plane J-J.
Figure 25:
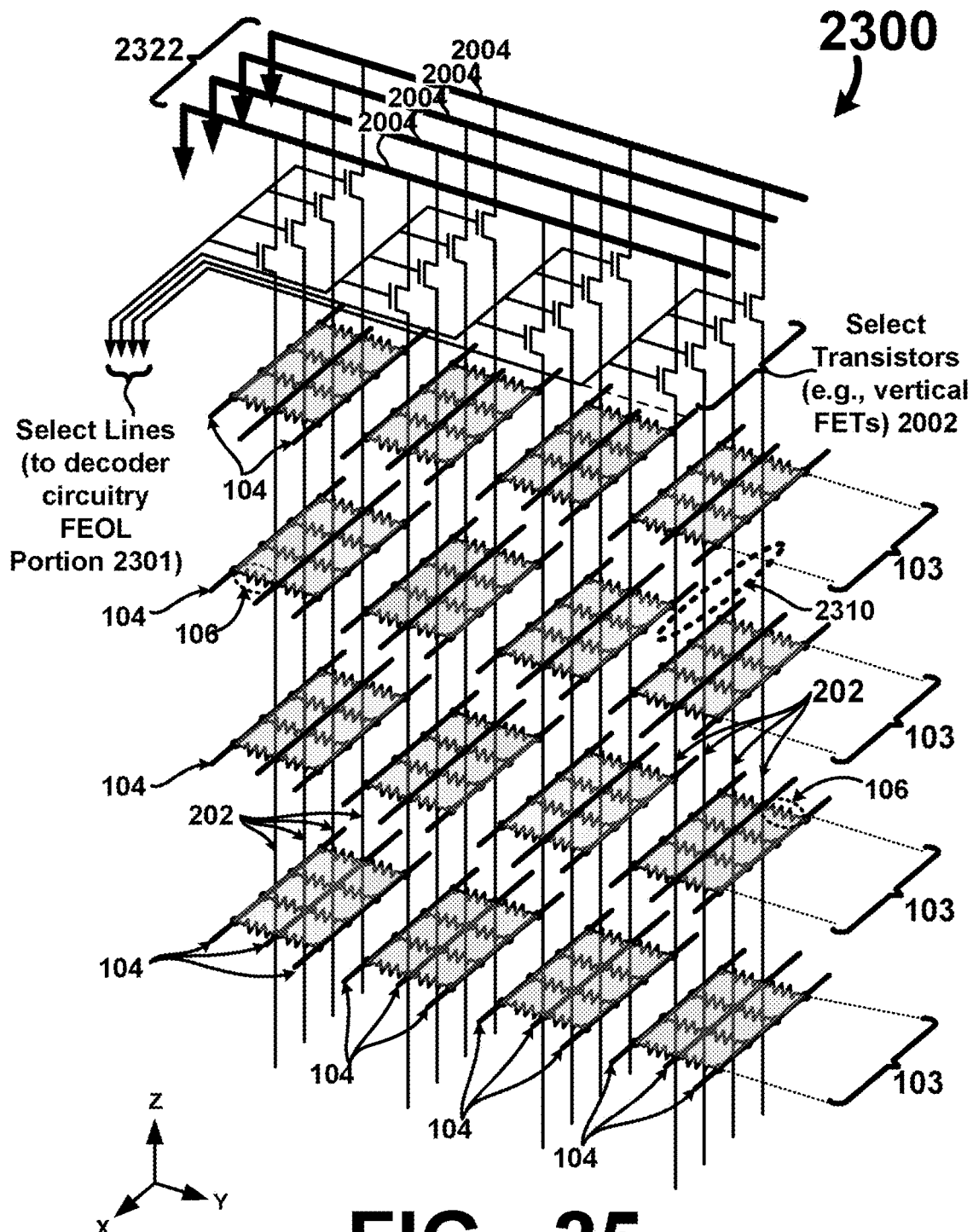
FIG. 25 is a schematic, perspective view of a BEOL portion of the memory structure depicted in FIGS. 23 and 24.

In the VCPAs of the exemplary memory structures described above, a row 108 of vertical lines 102 is positioned between each consecutive pair of horizontal lines 104 and the horizontal lines 104 are configured so that each horizontal line 104 connects to a vertical line 102 on each of its sides (i.e., edges)—one to the left and another to the right. (See, for example, FIGS. 1 and 2.) Interleaving the vertical and horizontal lines 102 and 104 according to that configuration yields a memory cell footprint of just $2F^2$ (see FIGS. 3 and 6 above), which in most circumstances is highly desirable. FIGS. 23-25 depict a memory structure 2300 having a VCPA 2302, according to another embodiment of the invention Like the VCPA 100 described above, the VCPA 2302 has vertical lines 102 with center conductors 202 surrounded by memory film layer(s) 204, horizontal lines 104, and memory cells 106, which, like the VCPA 100, may comprise resistive change memory cells (like or similar to the CMO-based memory cell 606 described in FIGS. 6-7), phase-change memory cells, magnetoresistive memory cells, ferroelectric memory cells, conductive bridge memory cells, carbon nanotube based memory cells, etc. However, instead of a row of vertical lines 102 being positioned between each consecutive pair of horizontal lines 104, a row 2310 of vertical lines 102 is positioned between every other consecutive pair of horizontal lines 104. This configuration results in a larger memory cell footprint 2406 (see FIG. 24) of $4F^2$ (a factor of two larger than the $4F^2$ footprint 206 of the VCPA 100). The increased memory cell footprint results from spaces 2306 between horizontal lines 104 that are formed by positioning the vertical lines 102 only between every other consecutive pair of horizontal lines 104. Nevertheless, this configuration may also benefit from bit lines wires positioned above and below the VCPA 2302 and from vertical selection devices (e.g., vertical FETs) in layer 2320 similar to as describe above in reference to FIGS. 20-22. If maximum memory cell density is the primary objective, the increased cell footprint is not particularly desirable, especially since the overall memory structure footprint is multiplicatively increased by the presence of multiple spaces 2306. However, in circumstances where it is difficult or not possible to fabricate all or substantially all of the logic circuitry 1304 directly beneath the VCPA (e.g., as depicted in FIG. 16B), the increased footprint may be acceptable and in some cases even desirable. Like the memory structures shown and described in FIGS. 20 and 21, the select transistors 2002 (e.g., vertical FETs) used to selectively couple the center conductors 202 of the vertical lines 202 to bit lines 2004 are formed in transistor layers 2320 above the VCPA 2302. Alternatively, they may be formed in transistor layers between the lowermost memory layer 103 of the VCPA 2302 and the uppermost layer of the FEOL portion 2301 or both in transistor layers above the VCPA 2302 and below the VCPA 2302, similar to as in FIG. 22.

Although the present invention has been described in detail with reference to certain preferred embodiments thereof, various changes in form and detail are possible. Therefore, the spirit and scope of the invention should not be limited to the description of the preferred versions contained herein, but instead should be construed in reference to the appended claims and conferred the full scope of equivalents to which such claims are entitled.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A vertical cross-point array (VCPA) comprising:
   a plurality of horizontal line layers, each horizontal line layer comprising a plurality of horizontal lines;
   a plurality of rows of vertical lines interleaved with the horizontal lines of said plurality of horizontal line layers, such that a row of vertical lines is positioned between each consecutive pair of horizontal lines in each horizontal line layer; and
   a plurality of conductive metal oxide (CMO)-based memory cells formed at intersections of the horizontal lines and the vertical lines,
   wherein each vertical line comprises a center conductor surround by an inner CMO layer and an outer insulating metal oxide (IMO) layer,
   wherein each horizontal line comprises a conductive line bounded on both sides by an inner diffusion barrier layer and an outer edge electrode layer, and
   wherein each CMO-based memory cell is disposed between the center conductor of a vertical line and the outer edge electrode layer of an adjacent horizontal line.

2. The VCPA of claim 1, wherein one or more of the vertical lines comprises an inner IMO layer and an outer CMO layer.

3. The VCPA of claim 1, wherein one or more of the horizontal lines comprises a CMO layer formed along the outer edge electrode layer.

4. The VCPA of claim 1, wherein the VCPA has a unit memory cell footprint of $2F^2$, where "F" is the minimum feature size of the VCPA.

5. The VCPA of claim 1, wherein the center conductor of each vertical line is positioned between a consecutive pair of CMO-based memory cells on each horizontal line layer.

6. The VCPA of claim 5, wherein the consecutive pair of CMO-based memory cells are patterned from a memory film formed on inner sidewalls of a corresponding vertical line and at least partially surrounding the center conductor.

7. The VCPA of claim 1, wherein the horizontal lines are interleaved with the vertical lines such that the edge electrode layers of the horizontal lines are in contact with the IMO layers of the vertical lines at junctions where the horizontal lines and the vertical lines intersect.

8. A memory structure comprising:
   a vertical cross-point array (VCPA) comprising:
      a plurality of horizontal line layers, each horizontal line layer comprising a plurality of horizontal lines;
      a plurality of rows of vertical lines interleaved with the horizontal lines of said plurality of horizontal line layers, such that a row of vertical lines is positioned between each consecutive pair of horizontal lines in each horizontal line layer; and
      a plurality of conductive metal oxide (CMO)-based memory cells formed at intersections of the horizontal lines and the vertical lines,
      wherein each vertical line comprises a center conductor surround by an inner CMO layer and an outer insulating metal oxide (IMO) layer,
      wherein each horizontal line comprises a conductive line bounded on both sides by an inner diffusion barrier layer and an outer edge electrode layer, and
      wherein each CMO-based memory cell is disposed between the center conductor of a vertical line and the outer edge electrode layer of an adjacent horizontal line;
   an upper bit line layer above said VCPA having a first plurality of horizontal bit lines; and
   a lower bit line layer below said VCPA having a second plurality of horizontal bit lines.

9. The memory structure of claim 8, further comprising:
   a substrate upon which at least one of a semiconductor layer, a gate layer, a gate dielectric layer, a metal layer, an intra-metal dielectric layer, or logic circuitry is formed; and
   one or more vias or interconnects configured to electrically couple the bit lines of said upper and lower bit line layers to bit line select devices in the logic circuitry.

10. The memory structure of claim 9, wherein the substrate, the at least one gate layer, gate dielectric layer, metal layer, intra-metal dielectric layer, the VCPA, and the one or more vias or interconnects collectively comprise a monolithically integrated and inseparable integrated circuit structure.

11. The memory structure of claim 9, wherein the logic circuitry is substantially disposed under said VCPA.

12. The memory structure of claim 8, wherein one or more of the vertical lines comprises an inner IMO layer and an outer CMO layer.

13. The memory structure of claim 8, wherein one or more of the horizontal lines comprises a CMO layer formed along the outer edge electrode layer.

14. The memory structure of claim 8, wherein the VCPA has a unit memory cell footprint of $2F^2$, where "F" is the minimum feature size of the VCPA.

15. The memory structure of claim 8, wherein the center conductor of each vertical line is positioned between a consecutive pair of CMO-based memory cells on each horizontal line layer.

16. The memory structure of claim 15, wherein the consecutive pair of CMO-based memory cells are patterned from a memory film formed on inner sidewalls of a corresponding vertical line and at least partially surrounding the center conductor.

17. The memory structure of claim 8, wherein the horizontal lines are interleaved with the vertical lines such that the edge electrode layers of the horizontal lines are in contact with the IMO layers of the vertical lines at junctions where the horizontal lines and the vertical lines intersect.

18. A vertical cross-point array (VCPA) comprising:
   a plurality of back-end of the line (BEOL) horizontal line layers, each horizontal line layer comprising a plurality of horizontal lines;
   a plurality of rows of BEOL vertical lines interleaved with the horizontal lines of said plurality of horizontal line layers, such that a row of vertical lines is positioned between each consecutive pair of horizontal lines in each horizontal line layer; and
   a plurality of BEOL conductive metal oxide (CMO)-based memory cells formed at intersections of the horizontal lines and the vertical lines,
   wherein each vertical line comprises a center conductor surround by an inner CMO layer and an outer insulating metal oxide (IMO) layer,
   wherein each horizontal line comprises a conductive line bounded on both sides by an inner diffusion barrier layer and an outer edge electrode layer, and
   wherein each CMO-based memory cell is disposed between the center conductor of a vertical line and the outer edge electrode layer of an adjacent horizontal line.

19. The VCPA of claim 18, wherein the center conductor of each vertical line is positioned between a consecutive pair of CMO-based memory cells on each horizontal line layer, and wherein the consecutive pair of CMO-based memory cells are patterned from a memory film formed on inner sidewalls of a corresponding vertical line and at least partially surrounding the center conductor.

20. The VCPA of claim 18, wherein the horizontal lines are interleaved with the vertical lines such that the edge electrode layers of the horizontal lines are in contact with the IMO layers of the vertical lines at junctions where the horizontal lines and the vertical lines intersect.

* * * * *